US012660596B2

(12) United States Patent
Shen et al.

(10) Patent No.: US 12,660,596 B2
(45) Date of Patent: Jun. 16, 2026

(54) SEMICONDUCTOR STRUCTURES AND METHODS OF FORMING THE SAME

(71) Applicant: Taiwan Semiconductor Manufacturing Company, Ltd., Hsin-Chu (TW)

(72) Inventors: Hsiang-Ku Shen, Hsinchu City (TW); Chun-Wen Hsiao, Hsinchu (TW); Fang-I Chih, Tainan City (TW); Wen-Ling Chang, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 462 days.

(21) Appl. No.: 18/313,853

(22) Filed: May 8, 2023

(65) Prior Publication Data

US 2024/0379595 A1     Nov. 14, 2024

(51) Int. Cl.
| | |
|---|---|
| *H10W 20/41* | (2026.01) |
| *H10P 50/00* | (2026.01) |
| *H10P 52/40* | (2026.01) |
| *H10W 20/00* | (2026.01) |
| *H10W 20/40* | (2026.01) |
| *H10W 72/90* | (2026.01) |

(52) U.S. Cl.
CPC ........... *H10W 20/425* (2026.01); *H10P 50/73* (2026.01); *H10P 52/403* (2026.01); *H10W 20/043* (2026.01); *H10W 20/056* (2026.01); *H10W 20/075* (2026.01); *H10W 20/496* (2026.01); *H10W 72/952* (2026.01)

(58) Field of Classification Search
CPC ............... H01L 24/05; H01L 21/31144; H01L 21/3212; H01L 21/376877; H01L 21/376832
See application file for complete search history.

(56) References Cited

U.S. PATENT DOCUMENTS 6,352,919 B1 * 3/2002 Tu ..................... H01L 21/76802
                                                              438/634
11,114,373 B1     9/2021 Hsiao
(Continued)

FOREIGN PATENT DOCUMENTS

| TW | 452919 B | 9/2001 |
|---|---|---|
| TW | 201739028 A | 11/2017 |

*Primary Examiner* — Walter L Lindsay, Jr.
(74) *Attorney, Agent, or Firm* — HAYNES AND BOONE, LLP

(57) ABSTRACT

A method includes providing a workpiece having a first conductive pad and a second conductive pad over a substrate, a topmost point of the second conductive pad is above that of the first conductive pad by a height difference, conformally forming a first etch stop layer on the first and the second conductive pads, forming a dielectric structure over the first etch stop layer, performing a planarization process to the dielectric structure, and after the performing of the planarization process, conformally depositing a dielectric layer over the workpiece, the dielectric layer including a first portion disposed directly over the first conductive pad and a second portion disposed directly over the second conductive pad, where a thickness difference between a thickness of the first portion of the dielectric layer and a thickness of the second portion of the dielectric layer is less than the height difference.

20 Claims, 22 Drawing Sheets

(56)     References Cited

U.S. PATENT DOCUMENTS

| | | | |
|---|---|---|---|
| 11,145,564 B2 | 10/2021 | Huang | |
| 11,145,592 B2 | 10/2021 | Shen | |
| 11,424,319 B2 | 8/2022 | Shen et al. | |
| 2020/0020684 A1 | 1/2020 | Chen | |
| 2020/0251443 A1 | 8/2020 | Kanakamedala | |
| 2021/0098399 A1 | 4/2021 | Huang | |
| 2021/0375748 A1* | 12/2021 | Huang | H10D 1/692 |
| 2023/0307366 A1* | 9/2023 | Wang | H01L 23/3192 |
| 2024/0113011 A1* | 4/2024 | Tu | H10D 1/68 |
| 2024/0203923 A1* | 6/2024 | Huang | H01L 24/20 |
| 2025/0349703 A1* | 11/2025 | Hsiao | H10D 1/042 |
| 2025/0349762 A1* | 11/2025 | Wang | H01L 24/05 |
| 2025/0351466 A1* | 11/2025 | Lu | H01L 23/53266 |

* cited by examiner

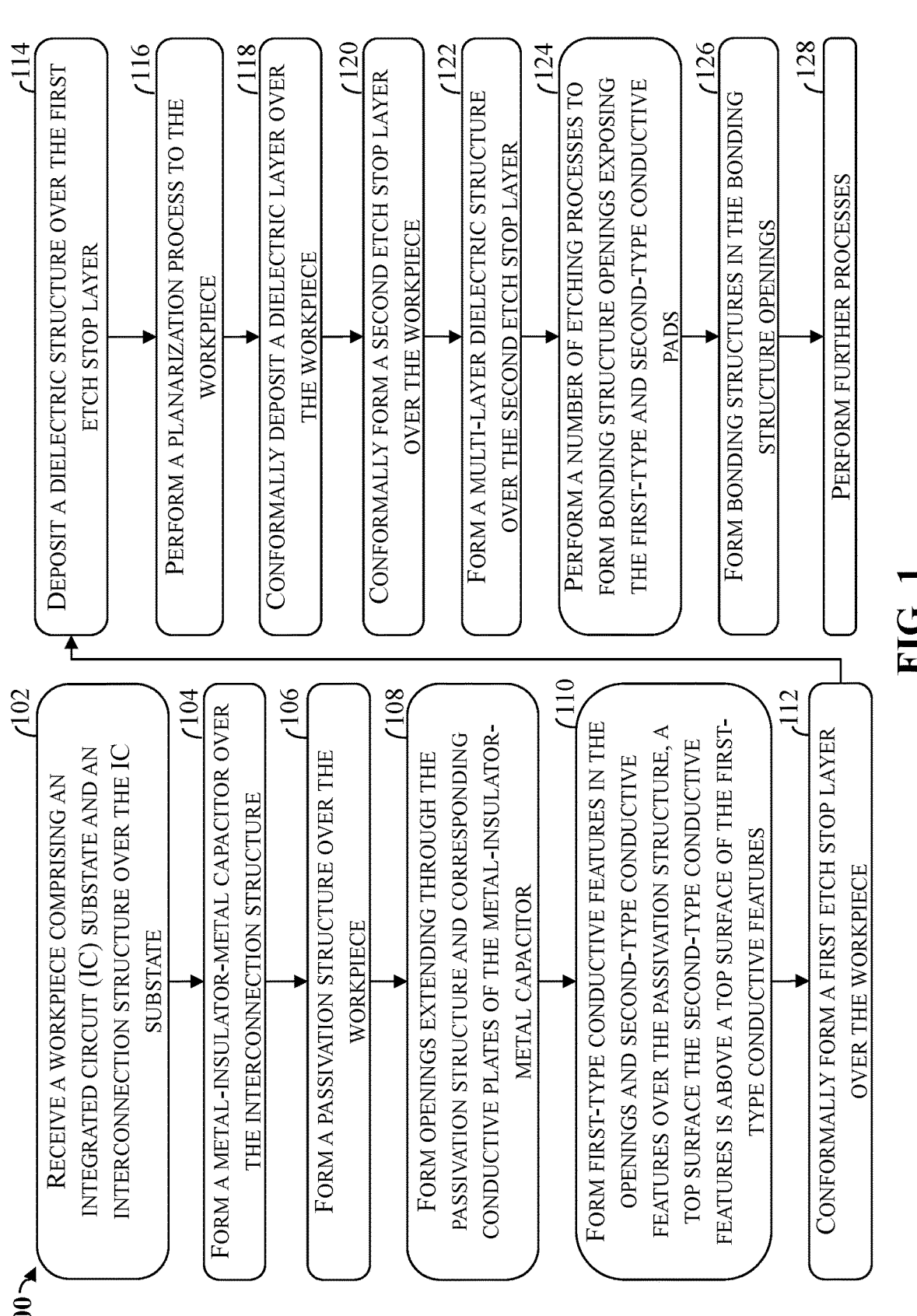

100

102 RECEIVE A WORKPIECE COMPRISING AN INTEGRATED CIRCUIT (IC) SUBSTATE AND AN INTERCONNECTION STRUCTURE OVER THE IC SUBSTATE

104 FORM A METAL-INSULATOR-METAL CAPACITOR OVER THE INTERCONNECTION STRUCTURE

106 FORM A PASSIVATION STRUCTURE OVER THE WORKPIECE

108 FORM OPENINGS EXTENDING THROUGH THE PASSIVATION STRUCTURE AND CORRESPONDING CONDUCTIVE PLATES OF THE METAL-INSULATOR-METAL CAPACITOR

110 FORM FIRST-TYPE CONDUCTIVE FEATURES IN THE OPENINGS AND SECOND-TYPE CONDUCTIVE FEATURES OVER THE PASSIVATION STRUCTURE, A TOP SURFACE THE SECOND-TYPE CONDUCTIVE FEATURES IS ABOVE A TOP SURFACE OF THE FIRST-TYPE CONDUCTIVE FEATURES

112 CONFORMALLY FORM A FIRST ETCH STOP LAYER OVER THE WORKPIECE

114 DEPOSIT A DIELECTRIC STRUCTURE OVER THE FIRST ETCH STOP LAYER

116 PERFORM A PLANARIZATION PROCESS TO THE WORKPIECE

118 CONFORMALLY DEPOSIT A DIELECTRIC LAYER OVER THE WORKPIECE

120 CONFORMALLY FORM A SECOND ETCH STOP LAYER OVER THE WORKPIECE

122 FORM A MULTI-LAYER DIELECTRIC STRUCTURE OVER THE SECOND ETCH STOP LAYER

124 PERFORM A NUMBER OF ETCHING PROCESSES TO FORM BONDING STRUCTURE OPENINGS EXPOSING THE FIRST-TYPE AND SECOND-TYPE CONDUCTIVE PADS

126 FORM BONDING STRUCTURES IN THE BONDING STRUCTURE OPENINGS

128 PERFORM FURTHER PROCESSES

FIG. 1

SEMICONDUCTOR STRUCTURES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, packages of integrated circuits are becoming increasingly complex, with more device dies packaged in the same package to achieve more functions. System-on-integrate-chip (SoIC) has been developed to include a number of device dies such as processors and memory cubes in the same package. The SoIC can include device dies formed using different technologies and have different functions bonded to the same device die, thus forming a system. This may save manufacturing cost and optimize device performance. Various conductive pads and bonding structures (e.g., bonding pad vias, bonding pad metal lines) are formed in device dies such that the SoIC may be able to fulfill satisfactory electrical functions. Although existing methods for forming the SoIC are generally adequate, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method for forming a semiconductor structure, in accordance with some embodiments of the present disclosure.

DETAILED DESCRIPTION

Figure 2:
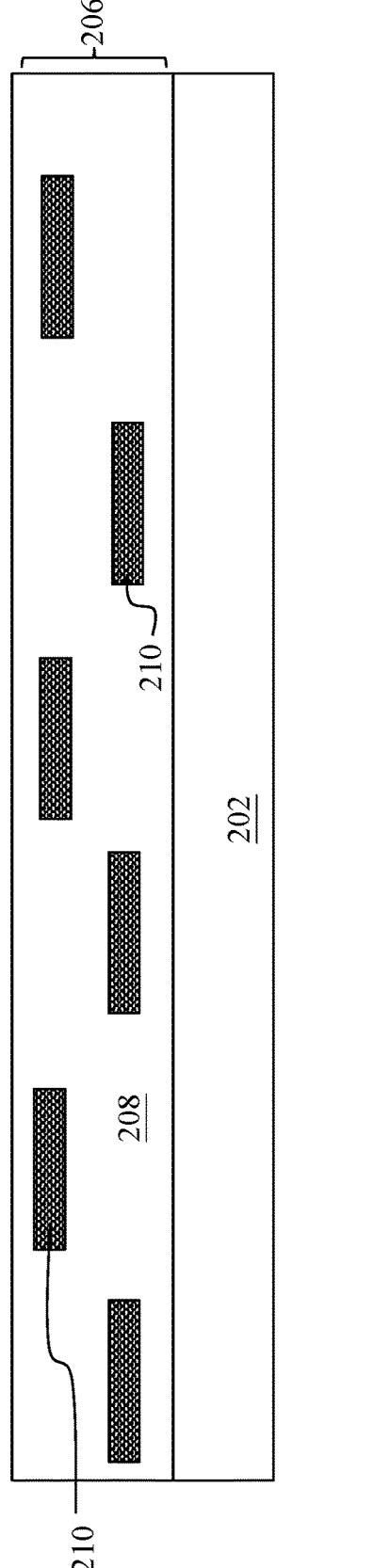
FIGS. 2, 3, 4, 5, 6, 7, 8, 9, 10, 11, 12, 13, 14, 15, 16, 17, 18, 19, 20, 21, and 22 illustrate fragmentary cross-sectional views of a semiconductor structure during a fabrication process according to the method of FIG. 1, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

The present disclosure provides various embodiments of system-on-integrate-chip (SoIC) packages and the method of forming the same. In an exemplary method, conductive pads with different profiles are formed. For example, top surfaces of first-type conductive pads formed in a first region of a workpiece is above top surfaces of second-type conductive pads formed in a second region of the workpiece. The height difference between those top surfaces may result in a loading effect for at least some of the dielectric layers formed over those conductive pads. By forming etch stop layers with different thicknesses, controlling polish end points of planarization processes, and performing different etching processes to form openings where bonding structures are to be formed, without over etching those conductive pads, the loading effect may be alleviated or substantially eliminated. Accordingly, yield and reliability of the SoIC packages may be improved. The intermediate stages of forming SoIC packages are illustrated in accordance with some embodiments. It is appreciated that although the formation of SoIC packages is used as examples to explain the concept of the embodiments of the present disclosure, the embodiments of the present disclosure are readily applicable to other bonding methods and structures.

The various aspects of the present disclosure will now be described in more detail with reference to the figures. In that regard, FIG. 1 is a flowchart illustrating method 100 of forming a semiconductor structure according to embodiments of the present disclosure. Method 100 is described below in conjunction with FIGS. 2-22, which are fragmentary cross-sectional views of a workpiece 200 at different stages of fabrication according to embodiments of method 100. Method 100 is merely an example and is not intended to limit the present disclosure to what is explicitly illustrated therein. Additional steps may be provided before, during, and after the method 100, and some steps described can be replaced, eliminated, or moved around for additional embodiments of the method. Not all steps are described herein in detail for reasons of simplicity. Because the workpiece 200 will be fabricated into a semiconductor structure or a SoIC package upon conclusion of the fabrication processes, the workpiece 200 may be referred to as the semiconductor structure 200 or a SoIC package 200 as the context requires. Throughout the present disclosure, like reference numerals denote like features unless otherwise excepted.

Referring to FIGS. 1 and 2, method 100 includes a block 102 where a workpiece 200 is received. In various embodiments, the workpiece 200 may be referred to as a semiconductor structure 200. The workpiece 200 includes an IC substrate 202. In some embodiments, the IC substrate 202 includes a semiconductor substrate, such as a silicon substrate. The IC substrate 202 may also include various devices, such as field-effect transistors (FETs), memory cells, imaging sensors, passive devices, other devices, or combinations thereof. In some embodiments, the IC substrate 202 includes flat active regions with various IC devices, such as planar field-effect transistors (FETs). In some other embodiments, the IC substrate 202 includes fin-shaped (e.g., vertically protruding) active regions with various IC devices formed thereon. As a non-limiting example, electrical circuitry (not shown) may be formed in the IC substrate 202. The electrical circuitry may include planar transistors or FinFET type transistors.

The workpiece 200 also includes an interconnection structure 206 formed over the IC substrate 202. The interconnection structure 206 includes various conductive components, such as metal lines (e.g., metal lines 210), contacts, and vias, to provide horizontal and vertical electrical routing. The metal lines such as the metal lines 210 are distributed in multiple metal layers, such as a first metal layer (e.g., a M1 layer), a second metal layer (e.g., a M2 layer), . . . and a top metal layer. Among other things, the conductive components of the interconnection structure 206 may provide electrical connectivity to the electrical circuitry in the IC substrate 202. The interconnection structure 206 also includes a dielectric material 208 configured to provide electrical isolation among the various conductive components, so as to prevent electrical shorting. The dielectric material 208 may include multiple dielectric layers and may be formed of Phospho Silicate Glass (PSG), Boro Silicate Glass (BSG), Boron-Doped Phospho Silicate Glass (BPSG), Fluorine-Doped Silicate Glass (FSG), Tetra Ethyl Ortho Silicate (TEOS), or the like and may be formed using spin coating, Flowable Chemical Vapor Deposition (FCVD), Chemical Vapor Deposition (CVD), Plasma Enhanced Chemical Vapor Deposition (PECVD), Low Pressure Chemical Vapor Deposition (LPCVD), or the like. In some embodiments, the dielectric material 208 may be formed from a low-k dielectric material having a k-value lower than about 3.0. The dielectric material 208 may also be formed from an extra-low-k (ELK) dielectric material having a k-value of less than 2.5. In some embodiments, the dielectric material 208 may be formed from an oxygen-containing and/or carbon containing low-k dielectric material, Hydrogen SilsesQuioxane (HSQ), MethylSilsesQuioxane (MSQ), the like, or a combination thereof. In some embodiments, some or all of dielectric layers of the dielectric material 208 are formed of non-low-k dielectric materials such as silicon oxide, silicon carbide (SiC), silicon carbonitride (SiCN), silicon oxycarbonitride (SiOCN), or the like. In some embodiments, etch stop layers (not shown), which may be formed of silicon carbide, silicon nitride, or the like, are formed between dielectric layers of the dielectric material 208. In some embodiments, the dielectric layers of the dielectric material 208 are formed from a porous material such as SiOCN, SiCN, SiOC, SiOCH, or the like. In some embodiments, the interconnection structure 206 may include one or more other types of layers, such as diffusion barrier layers (not shown). In some embodiments, the conductive components (e.g., metal lines 210) of the interconnection structure 206 may be formed of one or more conductive materials selected from, for example, tungsten, aluminum, copper, titanium, tantalum, titanium nitride, tantalum nitride, or alloys thereof.

In some embodiments, the interconnection structure 206 may be formed using a single and/or a dual damascene process, a via-first process, or a metal-first process. In an embodiment, an insulating layer (not separately labeled) is formed, and openings (not shown) are formed therein using acceptable photolithography and etching techniques. Diffusion barrier layers (not shown) may be formed in the openings and may include a material such as TaN, Ta, TiN, Ti, CoW, or the like, and may be formed in the openings using a deposition process such as chemical vapor deposition (CVD), Atomic Layer Deposition (ALD), or the like. A conductive material may be formed in the openings from copper, aluminum, nickel, tungsten, cobalt, silver, combinations thereof, or the like, and may be formed over the diffusion barrier layers in the openings using an electrochemical plating process, chemical vapor deposition (CVD), atomic layer deposition (ALD), physical vapor deposition (PVD), the like, or a combination thereof. After formation of the conductive material, excess conductive material may be removed using, for example, a planarization process such as chemical mechanical polishing (CMP), thereby leaving conductive features (e.g., metal lines 210) in the openings of the respective insulating layer. The process may then be repeated to form additional insulating layers and conductive features therein.

Figure 3:
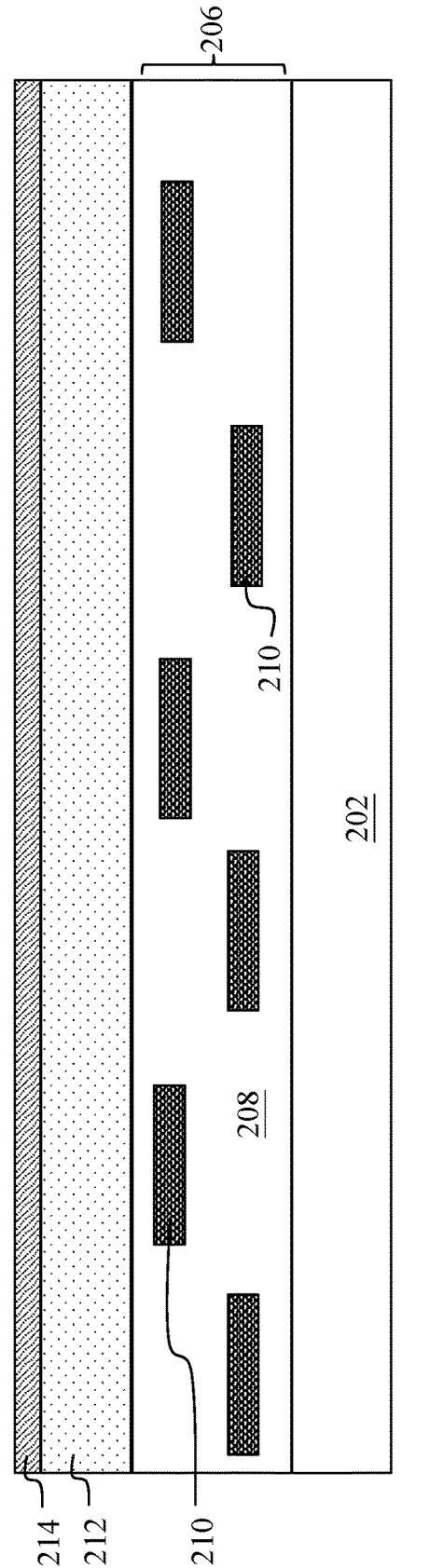

Referring to FIGS. 1 and 3-8, method 100 includes a block 104 where a metal-insulator-metal (MIM) capacitor 224 is formed in a first region 200A of the workpiece 200 and over the interconnection structure 206. Referring now to FIG. 3, in some embodiments, before forming the MIM capacitor 224, a passivation film 212 is formed over the interconnection structure 206, for example over a top metal layer of the interconnection structure 206. The passivation film 212 may provide protection to the IC substrate 110. In some embodiments, the passivation film 212 includes a silicon nitride (SiN) film and an un-doped silica glass (USG) film on the SiN film. These films are formed by suitable deposition techniques, such as by high density plasma chemical vapor deposition (HDPCVD), etc.

Figure 4:
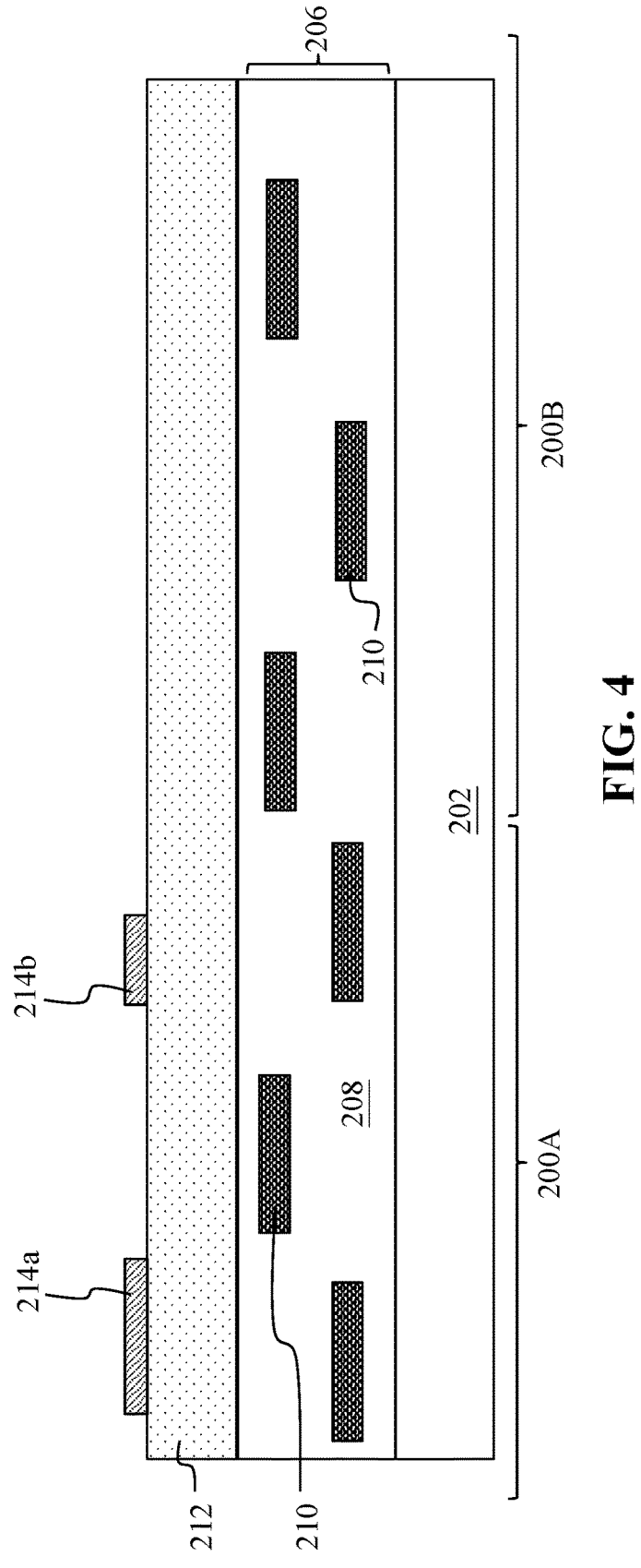

As represented in FIG. 3, the formation of the MIM capacitor 224 includes forming a first conductive layer 214 over the passivation film 212. The first conductive layer 214 may be deposited over the workpiece 200 using PVD, CVD, or metal organic chemical vapor deposition (MOCVD). In some embodiments, the first conductive layer 214 may include titanium (Ti), tantalum (Ta), titanium nitride (TiN), tantalum nitride (TaN), copper (Cu), cobalt (Co), nickel (Ni), tungsten (W), aluminum (Al), or other suitable materials. The first conductive layer 214 may cover an entire top surface of the workpiece 200. After forming the first conductive layer 214, as represented in FIG. 4, the first conductive layer 214 is patterned to form a first conductor plate 214a and a first dummy plate 214b in the first region 200A. The patterning may include deposition of a hard mask layer over the first conductive layer 214, formation of a photoresist layer over the hard mask layer, patterning of the photoresist layer using photolithography, etching of the hard mask layer using the patterned photoresist layer as an etch mask, and then etching of the first conductive layer 214 using the patterned hard mask as an etch mask. The hard mask layer and the photoresist layer may be selectively removed after forming the first conductor plate 214a and the first dummy plate 214b.

Figure 5:
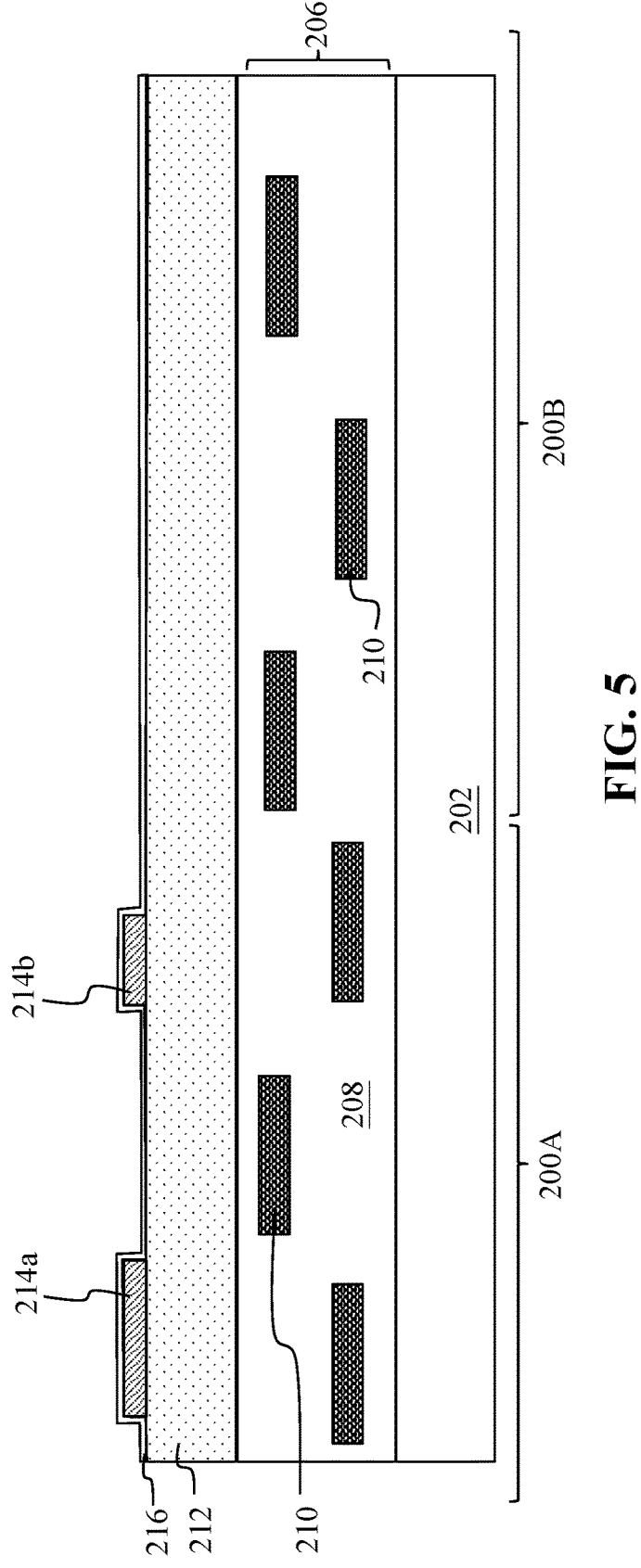

The formation of the MIM capacitor 224 then proceeds to forming a first insulator layer 216 over the workpiece 200. As shown in FIG. 5, after the first conductive layer 214 is patterned to form the first conductor plate 214a and the first dummy plate 214b, the first insulator layer 216 is deposited. In an embodiment, the first insulator layer 216 is conformally deposited to have a generally uniform thickness over the top surface of the workpiece 200 (e.g., having about the same thickness on top and sidewall surfaces of the first conductor plate 214a). The first insulator layer 216 may be deposited using CVD, ALD, or a suitable deposition method and may be a high-k dielectric layer that includes hafnium oxide, aluminum oxide, zirconium oxide, titanium oxide, tantalum oxide, or a combination thereof.

Figure 6:
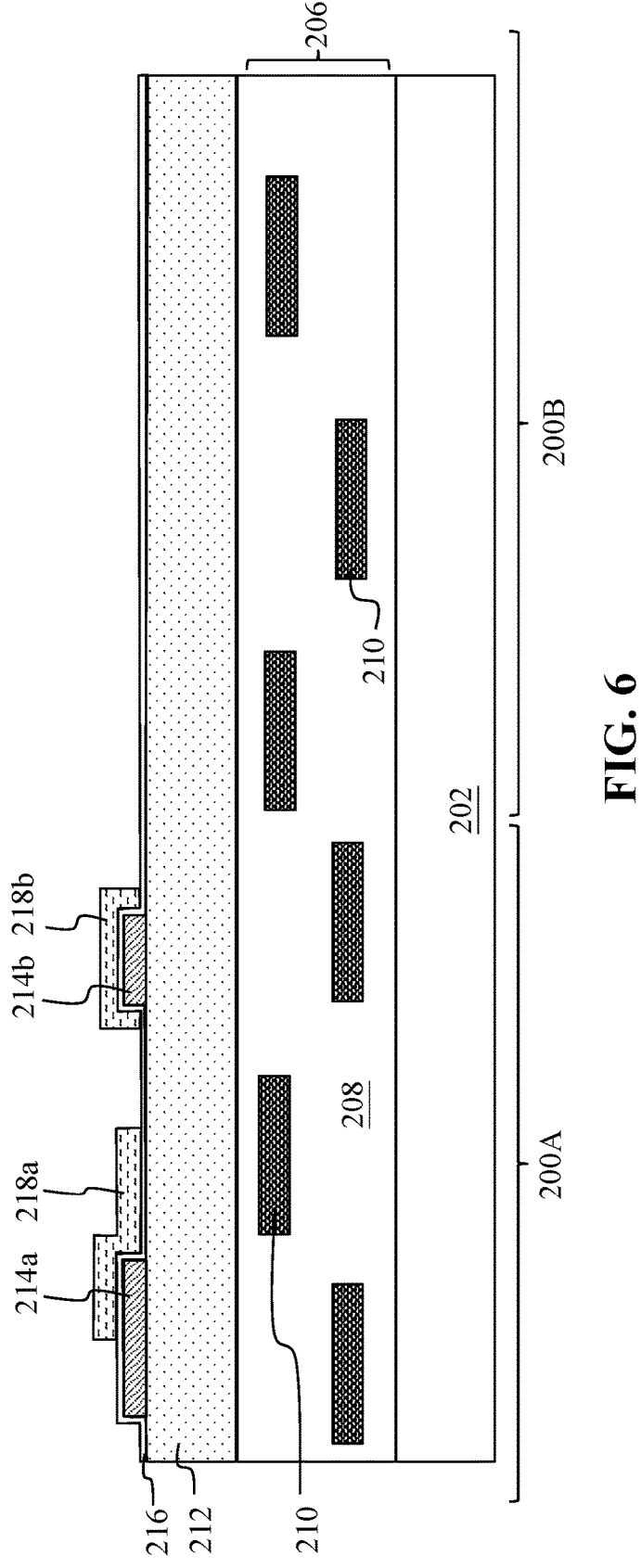

After forming the first insulator layer 216, referring to FIG. 6, the formation of the MIM capacitor 224 proceeds to forming a second conductor plate 218a and a second dummy plate 218b on the first insulator layer 216 and in the first region 200A. In this illustrated example, the second conductor plate 218a is formed directly over and vertically overlapped with the first conductor plate 214a, and the second dummy plate 218b is formed directly over and vertically overlapped with the first dummy plate 214b. The formation of the second conductor plate 218a and the second dummy plate 218b may be similar to the formation of the first conductor plate 214a and the first dummy plate 214b, respectively. For example, a second conductive layer may be deposited over the workpiece 200 and then patterned to form the second conductor plate 218a and the second dummy plate 218b.

Figure 7:
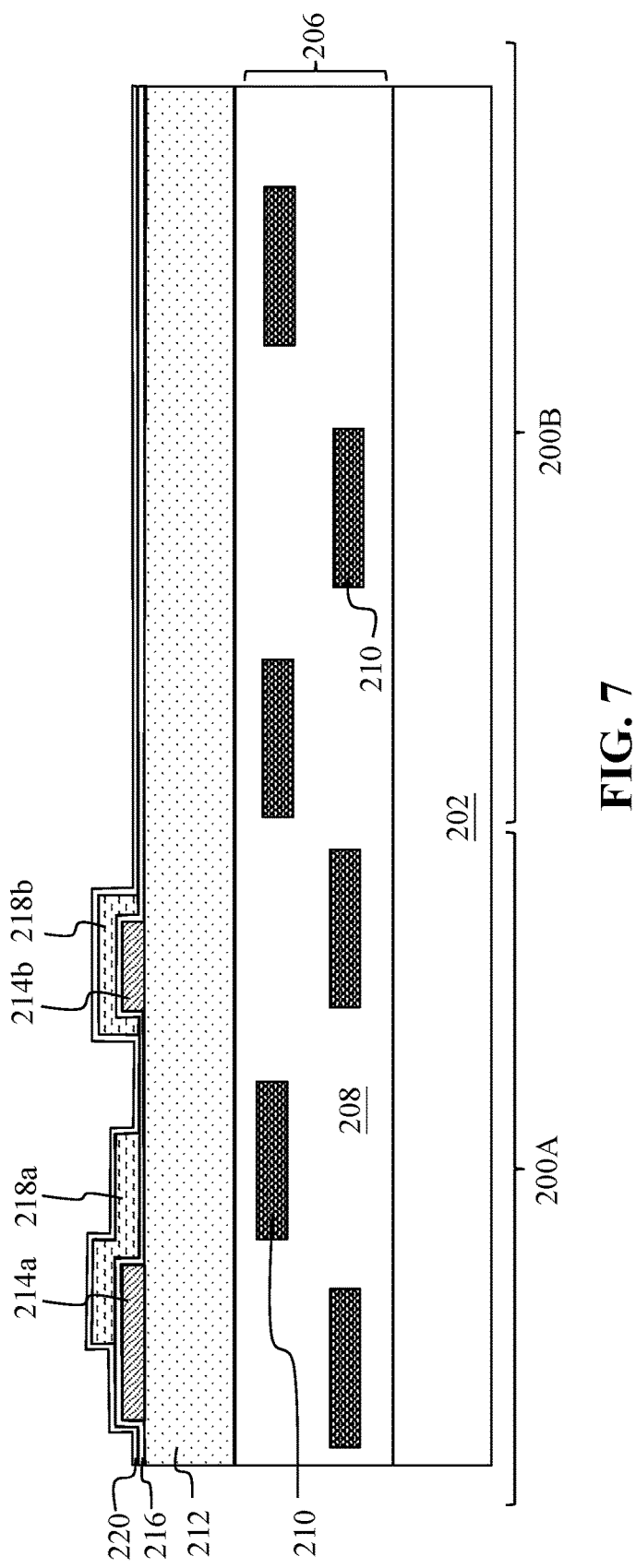

In the present embodiments, after forming the second conductor plate 218a, referring to FIG. 7, the formation of the MIM capacitor 224 proceeds to forming a second insulator layer 220 over the workpiece 200. In an embodiment, the second insulator layer 220 is conformally deposited to have a generally uniform thickness over the top surface of the workpiece 200 (e.g., having about the same thickness on top and sidewall surfaces of the second conductor plate 218a). The formation and composition of the second insulator layer 220 may be similar to those of the first insulator layer 216 and repeated description is omitted for reason of simplicity.

Figure 8:
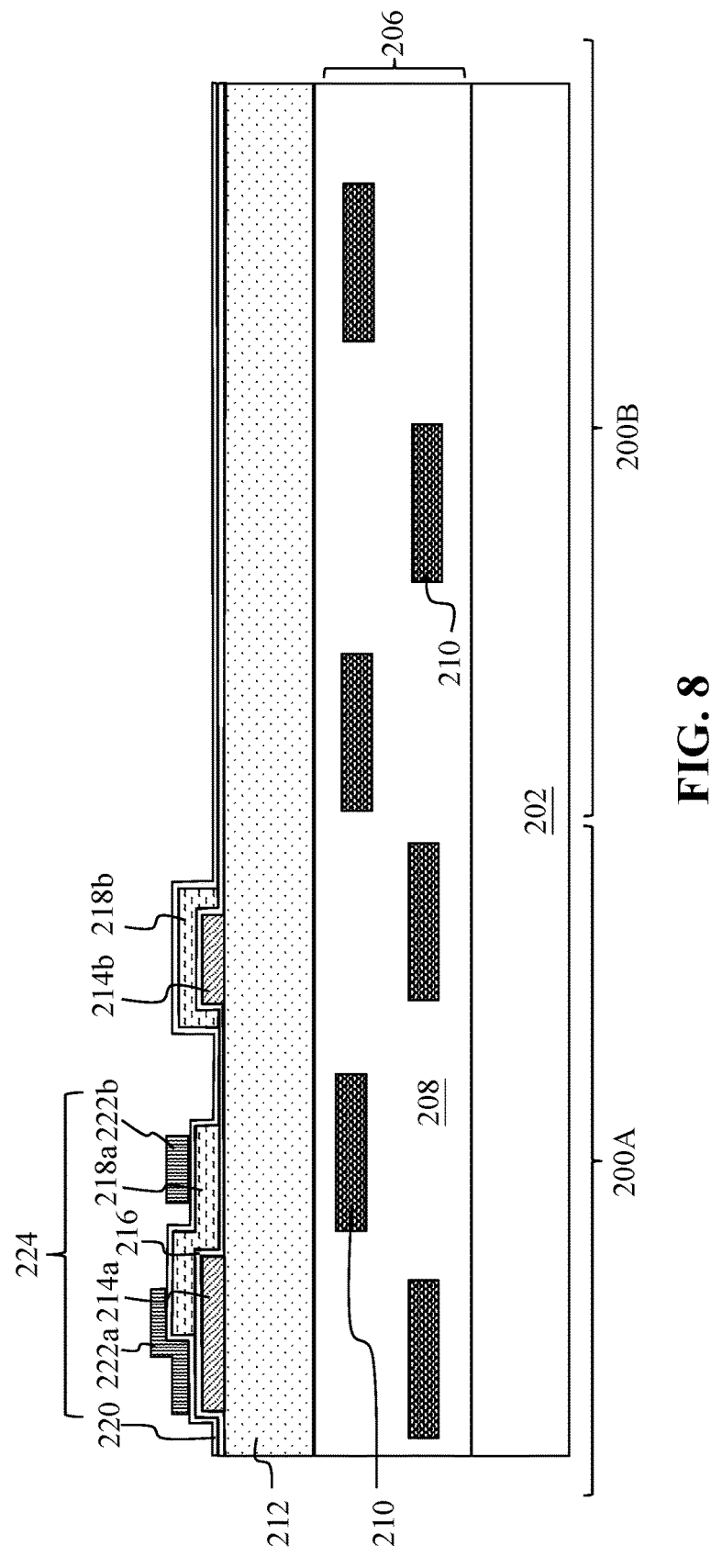

In embodiments represented in FIG. 8, the formation of the MIM capacitor 224 proceeds to forming a third conductor plate 222a and a third dummy plate 222b on the second insulator layer 220 and in the first region 200A. More specifically, in embodiments represented in FIG. 8, the third conductor plate 222a is formed directly over the second conductor plate 218a and is vertically overlapped with the first conductor plate 214a, and the third dummy plate 222b is formed directly over the second conductor plate 218a without being vertically overlapped with the first conductor plate 214a. The formation and composition of the third conductor plate 222a and third dummy plate 222b may be similar to those of the first conductor plate 214a and the first dummy plate 214b, respectively, and repeated description is omitted for reason of simplicity.

After the formation of the third conductor plate 220a, the structure of the MIM capacitor 224 is finalized. Note that the MIM capacitor 224 is a multi-plate capacitor that may include more than just two conductor plates (or more than two metal layers). For example, the MIM capacitor 224 as shown in FIG. 8 may include three conductor plates 214a, 218a, and 222a that are vertically stacked over one another. Since a capacitor includes two electrodes, some of these conductor plates may be electrically coupled together to serve as one electrode. It is also understood that FIGS. 3-8 merely illustrate a non-limiting example of the fabrication process for a MIM capacitor 224. The arrangement or configuration of the various conductor plates 214a, 218a, and 222a of the MIM capacitor 224 shown in FIG. 8 is not meant to be limiting. The MIM capacitor 224 may have other shapes or configurations, or other number of functional conductor or metal plates (e.g., more than three) and dummy plates in other embodiments.

Figure 9:
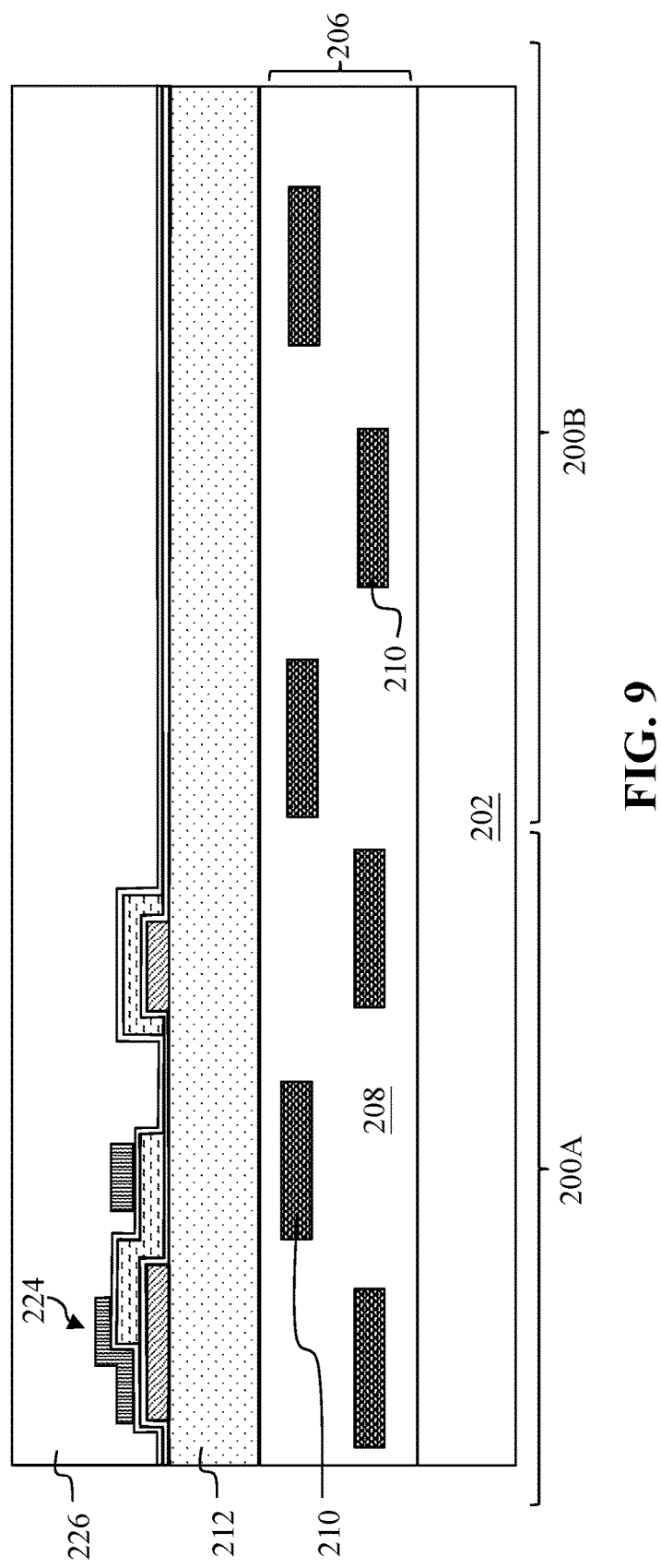

Referring to FIGS. 1 and 9, method 100 includes a block 106 where a passivation structure 226 is formed over the MIM capacitor 224. As shown in FIG. 9, the MIM capacitor 224 is sandwiched between the passivation structure 226 and the passivation film 212. In some embodiments, the passivation structure 226 may include a dielectric layer or two or more dielectric layers formed by any suitable materials such as silicon oxide or silicon nitride. In an embodiment, the passivation structure 226 includes silicon oxide formed by plasma-enhanced chemical vapor deposition (PECVD).

Figure 10:
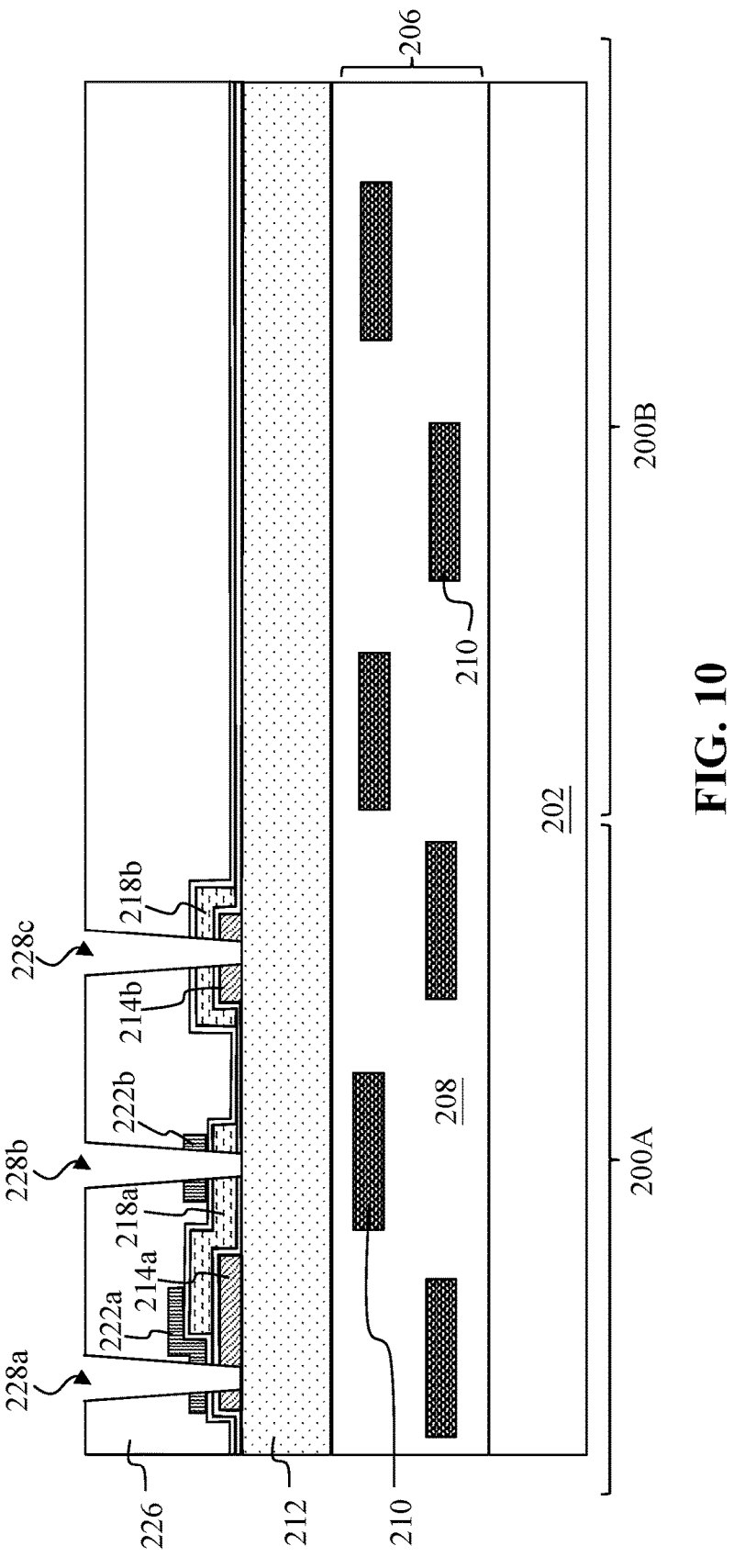

Referring to FIGS. 1 and 10, method 100 includes a block 108 where openings 228a, 228b, and 228c are formed in the first region 200A. After forming the passivation structure 226, a patterned mask film (not shown) is formed on the passivation structure 226. While using the patterned mask film as an etch mask, an etching process may be performed to form the openings 228a-228c, as represented in FIG. 10. In the illustrated embodiment, the opening 228a extends through both the third conductor plate 222a and the first conductor plate 214a, the opening 228b extends through both the third dummy plate 222b and the second conductor plate 218a, and the opening 228c extends through both the first dummy plate 214b and the second dummy plate 218b. It is understood that the openings 228a-228c may also extend through the passivation film 212 and expose conductive components (e.g., metal lines 210) of the interconnection structure 206 such that at least some of the to-be-formed conductive pads (e.g., conductive pads 236, 238, 240 shown in FIG. 11) may electrically interconnect the electrodes or conductor plates of the MIM capacitor 224 to the interconnection structure 206. After forming the openings 228a-228c, the patterned mask film may be selectively removed.

Figure 11:
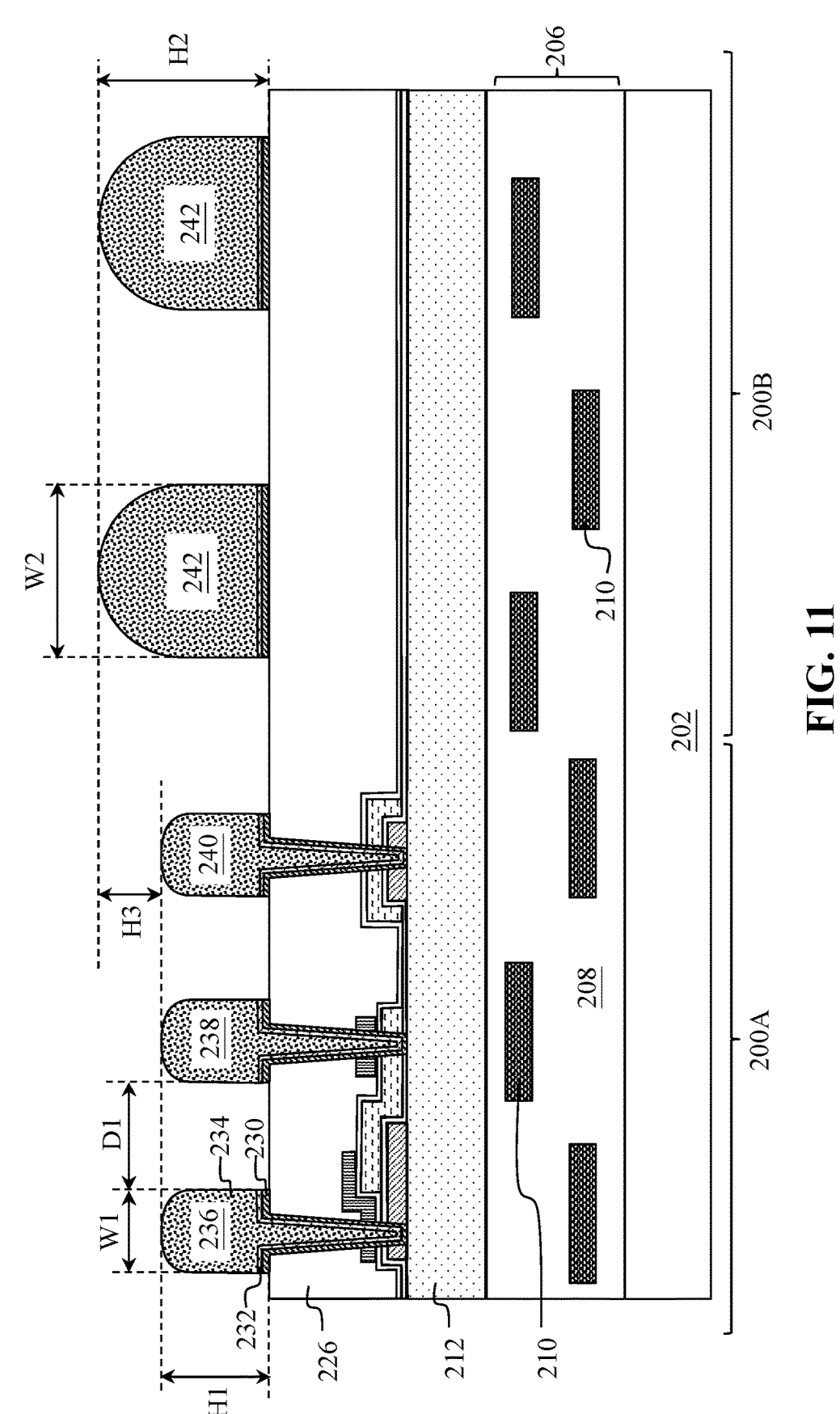

Referring to FIGS. 1 and 11, method 100 includes a block 108 where first-type conductive pads (e.g., conductive pads 236, 238, 240) are formed in the first region 200A and second-type conductive pad(s) (e.g., conductive pad 242) are formed in a second region 200B of the workpiece 200. After forming the openings 228a-228c in the first region 200A, with reference to FIG. 11, first-type conductive pads (e.g., conductive pads 236, 238, and 240) are formed in the openings 228a-228c and over the passivation structure 226 in the first region 200A, respectively, and second-type conductive pads (e.g., conductive pads 242) are formed over the passivation structure 226 and in the second region 200B that is adjacent to the first region 200A. More specifically, in the present embodiments, to form the conductive pads in the first region 200A and second region 200B, a barrier material layer (not shown) is first conformally deposited over the passivation structure 226 and into the openings 228a-228c using a suitable deposition technique, such as ALD, PVD or CVD. The barrier material layer may include titanium, titanium nitride, tantalum, tantalum nitride, tungsten, cobalt, cobalt nitride, tungsten nitride, ruthenium, ruthenium nitride, other metal, or other metal nitride. After the forming of the barrier material layer, a blanket seed material layer is then formed over the barrier material. The seed material layer may include copper or a copper alloy. In an embodiment, the seed material layer is formed of copper. The barrier material layer and the seed material layer may be then patterned to form barrier layers 230 and seed layers 232 in the openings 228a-228c and over the passivation structure 226 in the first region 200A and second region 200B. The barrier layers 230 and seed layers 232 in the first region 200A include portions in the openings 228a-228c and portion directly over the passivation structure 226, and entirety of the barrier layers 230 and seed layers 232 in the second region 200B are formed directly over the passivation structure 226.

After the forming of the barrier layers 230 and seed layers 232 in the first region 200A and second region 200B, an electrochemical plating (ECP) process is performed to form metal fill layers 234 on the seed layers 232. In an embodiment, the metal fill layers 234 are formed of copper (Cu). The barrier layer 230, the seed layer 232, and the metal fill layer 234 formed in and over the opening 228a are collectively referred to as a conductive pad 236. The barrier layer 230, the seed layer 232, and the metal fill layer 234 formed in and over the opening 228b are collectively referred to as a conductive pad 238. The barrier layer 230, the seed layer 232, and the metal fill layer 234 formed in and over the opening 228c are collectively referred to as a conductive pad 240. The barrier layer 230, the seed layer 232, and the metal fill layer 234 formed directly over the passivation structure 226 in the second region 200B of the workpiece are collectively referred to as a conductive pad 242. In the present embodiments, two conductive pads 242 are illustrated in FIG. 11, but it is understood that the workpiece 200 may include any suitable number of conductive pads 242. The conductive pads (e.g., conductive pads 236, 238, 240) formed in the first region 200A may be referred to as first-type conductive pads. The conductive pads 242 formed in the second region 200B may be referred to as second-type conductive pads 242. The first-type and second-type conductive pads may have convex top surfaces that curve inward. In some embodiments, each of the first-type conductive pads 236/238/240 spans a width W1 along the X direction, and each of the conductive pads 242 spans a width W2 along the X direction, the width W2 may be greater than the width W1 to provide flexible bonding configurations. Two adjacent conductive pads of the conductive pads 236/238/240 are spaced by a distance D1. In some embodiments, to provide a compact SoIC, the distance D1 is between about 3 um and about 10 um.

During the electrochemical plating (ECP) process, due to nature of the ECP process, while the metal fill layers 234 in the first region 200A are formed to first fill the openings 228a-228c, the metal fill layers 234 in the second region 200B are formed directly over the passivation structure 226. That is, due to the existence of the openings 228a-228c in the first region 200A, after the ECP process, the portion of the metal fill layers 234 that are formed directly over the passivation structure 226 in the first region 200A has a height H1 that is less than a height H2 of the metal fill layers 234 that are formed directly over the passivation structure 226 in the second region 200B. In other words, a topmost point of a top surface of the second-type conductive pad 242 is above a topmost point of a top surface of the first-type conductive pad 236/238/240. In an embodiment, a height difference H3 between the height H1 and the height H2 is between about 1 um and 2.5 um. It is noted that, in embodiments where the metal fill layers 234 are not formed by ECP, the height difference H3 may be negligible. For example, in embodiments where the metal fill layers 234 are formed using CVD or ALD and may include Al or AlCu, after the deposition process, a planarization process and a combination of lithography and etching processes may be performed to form Al-based metal fill layers. As such, top surfaces of the first-type conductive pads and second-type conductive pads will be substantially co-planar. That is, the present disclosure mainly focuses on solving problems (e.g., loading effect for dielectric layers formed over the conductive pads) caused by ECP process.

Figure 12:

Referring to FIGS. 1 and 12, method 100 includes a block 112 where a first etch stop layer 244 is conformally formed over the workpiece 200. After forming the first-type conductive pads 236, 238, 240 and the second-type conductive pads 242, the first etch stop layer 244 is conformally formed over the workpiece 200 using CVD, ALD, or a suitable deposition method to have a generally uniform thickness TO over the top surface of the workpiece 200. The first etch stop layer 244 is configured to indicate the polish end point of a subsequent planarization process (e.g., planarization process 247) and an etch end point of a subsequent etching process (e.g., etching process 268). In an embodiment, the first etch stop layer 244 includes silicon nitride (SiN). To ensure that the subsequently formed dielectric layers (e.g., dielectric structure 246) are able to substantially fill the space between two adjacent first-type conductive pads to provide satisfactory isolation, and due to the limitation of the distance D1, the thickness TO of the first etch stop layer 244 may be between about 0.05 um and about 0.25 um.

Figure 13:
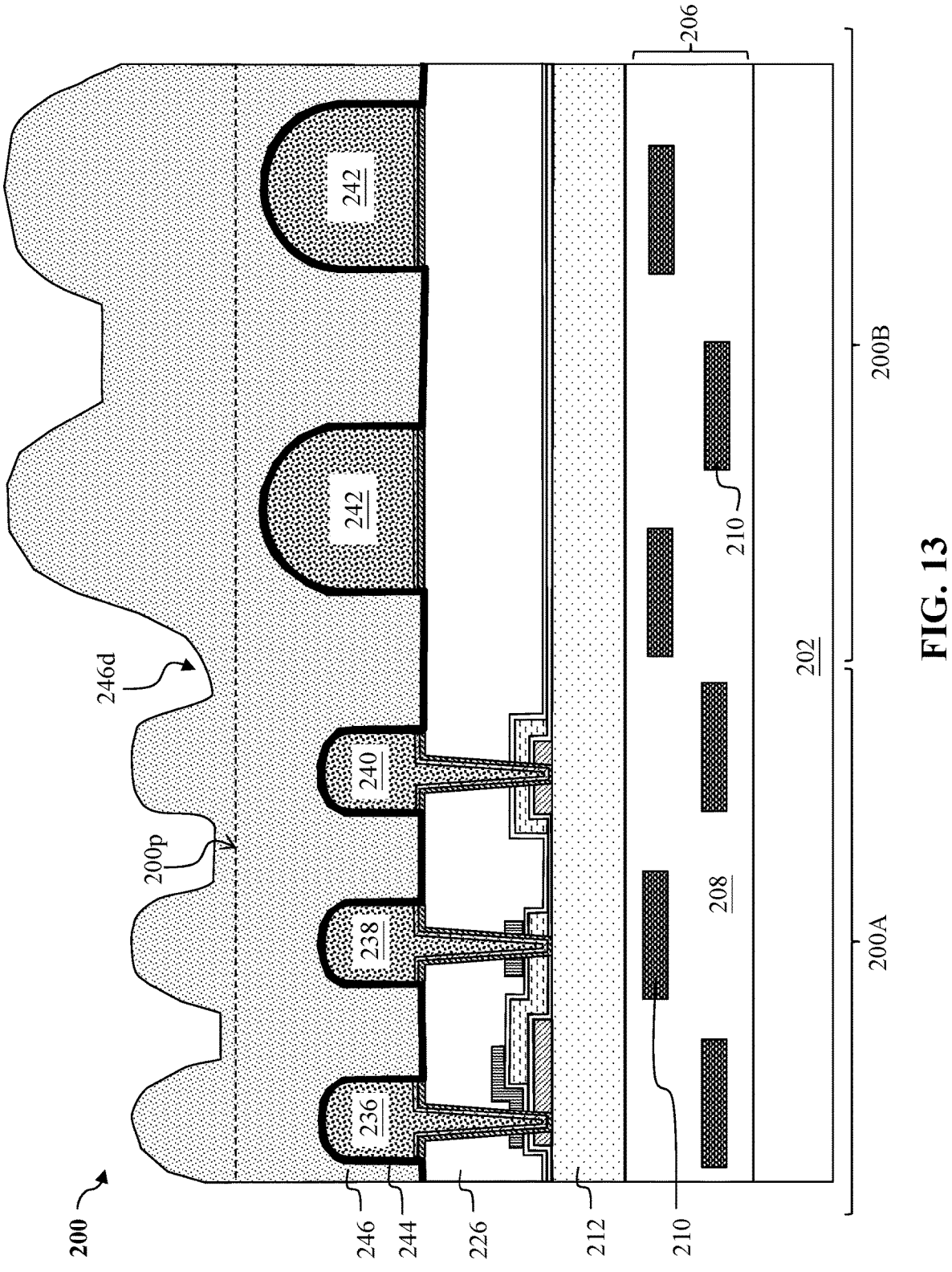

Referring to FIGS. 1 and 13, method 100 includes a block 114 where a dielectric structure 246 is formed over the first etch stop layer 244. With respect to FIG. 13, after forming the first etch stop layer 244, the dielectric structure 246 is formed on the first etch stop layer 244. In some embodiments, the dielectric structure 246 may function as a polishing film. The dielectric structure 246 may include one or more dielectric layers. In an embodiment, the formation of the dielectric structure 246 includes forming an oxide layer by performing a high-density plasma CVD (HDPCVD) process and then forming a dielectric layer (e.g., un-doped silica glass (USG) film) on the oxide layer using CVD, ALD, or other suitable processes. Due to the height difference H3, as illustrated in FIG. 13, the dielectric structure 246 suffer from topography dishing (e.g., curved surface 246d) especially in a region between the first-type conductive pad 240 and the second-type conductive pad 242 adjacent to the first-type conductive pad 240.

Figure 14:
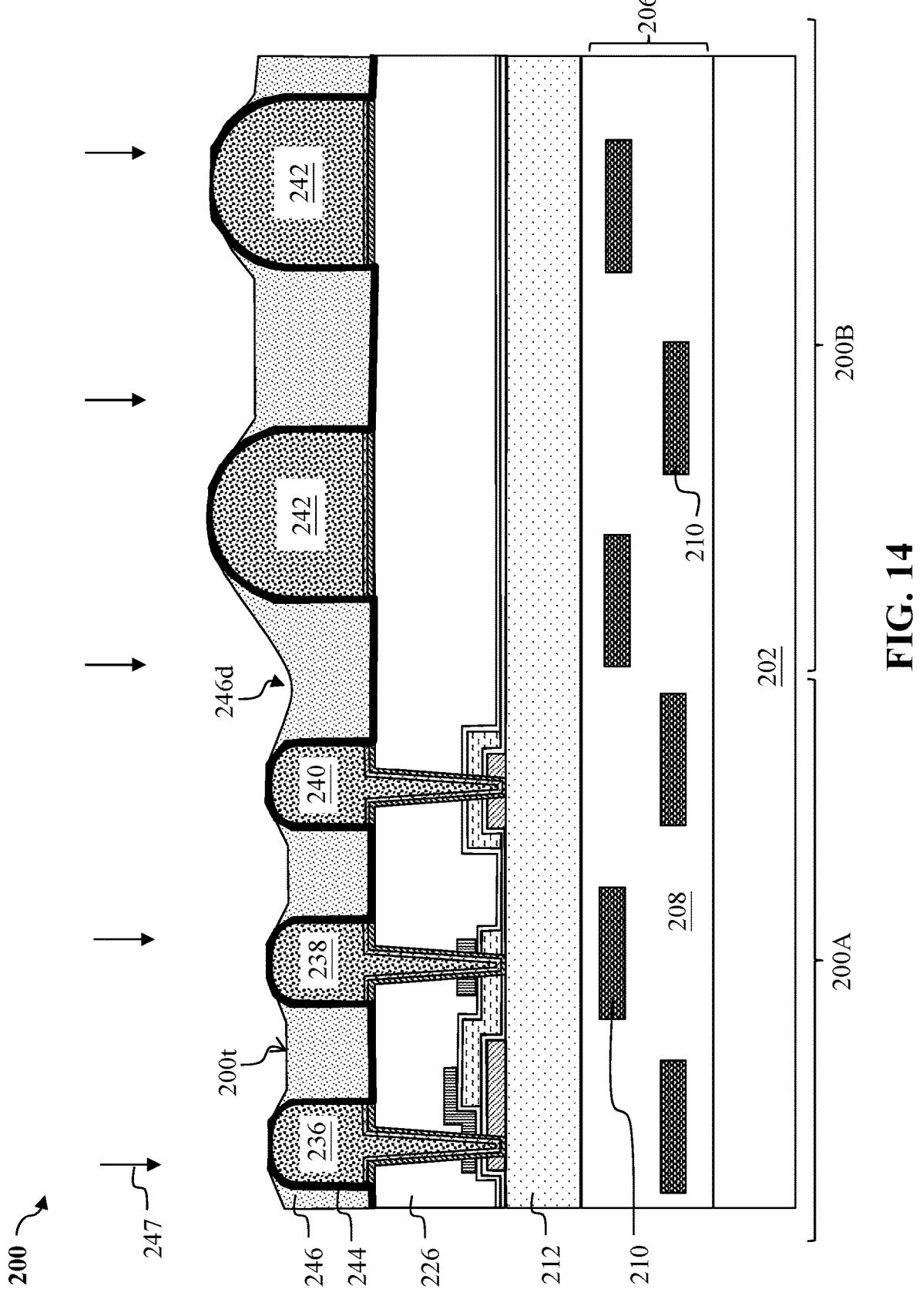

Referring to FIGS. 1 and 14, method 100 includes a block 116 where a planarization process (e.g., CMP) 247 is performed to the workpiece 200. In the present embodiments, the polish end point of the planarization process 247 is controlled by the first etch stop layer 244. Since the first etch stop layer 244 has a non-planar top surface, and due to the height difference H3, as indicated in FIG. 14, after the planarization process 247, the workpiece 200 has a non-planar top surface 200t. The height difference H3 between the first-type conductive pads 236/238/240 and the second-type conductive pads 242 also causes processing issues such as dishing (e.g., curved surface 246d) in the planarization process 247 in the region between the first-type conductive pad 240 and the second-type conductive pad 242 adjacent to the first-type conductive pad 240. The dishing shown in FIG. 14 is caused by uneven material removal rate during the planarization process.

If the planarization process 247 is configured to provide the workpiece 200 a substantially planar top surface 200p (as indicated by the dashed line shown in FIG. 13), the loading effect will disadvantageously affect the formation of the bonding structures, leading to degraded performance. More specifically, if the planarization process 247 is configured to provide the workpiece 200 the substantially planar top surface 200p that is above the topmost point of the second-type conductive pads 242, a distance between the planar top surface 200p and the topmost point of the first-type conductive pad 236/238/240 would be greater than a distance between the planar top surface 200p and the topmost point of the second-type conductive pad 242. That is, the portion of the planarized dielectric structure 246 that is formed directly over the first-type conductive pad 236/238/240 is thicker than the portion of the planarized dielectric structure 246 that is formed directly over the second-type conductive pad 242. The thickness difference may be substantially equal to the height difference H3. However, this loading effect would disadvantageously affect the etching results of the etching process implemented to form bonding structure openings (e.g., the openings 270a-270b). More specifically, when the etching process has a short duration, the portion of the planarized dielectric structure 246 that is formed directly over the first-type conductive pad 236/238/240 may not be fully etched to expose the first-type conductive pad 236/238/240, leading to poor electrical connection between the first-type conductive pad 236/238/240 and the subsequently formed bonding structures 272, and the yield of the semiconductor structure 200 may thus be degraded; when the etching process has a long duration, the portion of the thin first etch stop layer 244 formed directly over the second-type conducive pads 242 may be removed earlier than that formed directly over the first-type conductive pad 236/238/240, and the second-type conductive pads 242 (formed of copper) thereunder may be over etched. The particles generated due to the over-etching of the second-type conductive pads 242 may disadvantageously affect the performance of the semiconductor structure 200. Therefore, in the present disclosure, the polish end point of the planarization process 247 is controlled to stop at the first etch stop layer 244, and the resulted workpiece 200 (shown in FIG. 14) has a non-planar top surface 200t.

Figure 15:
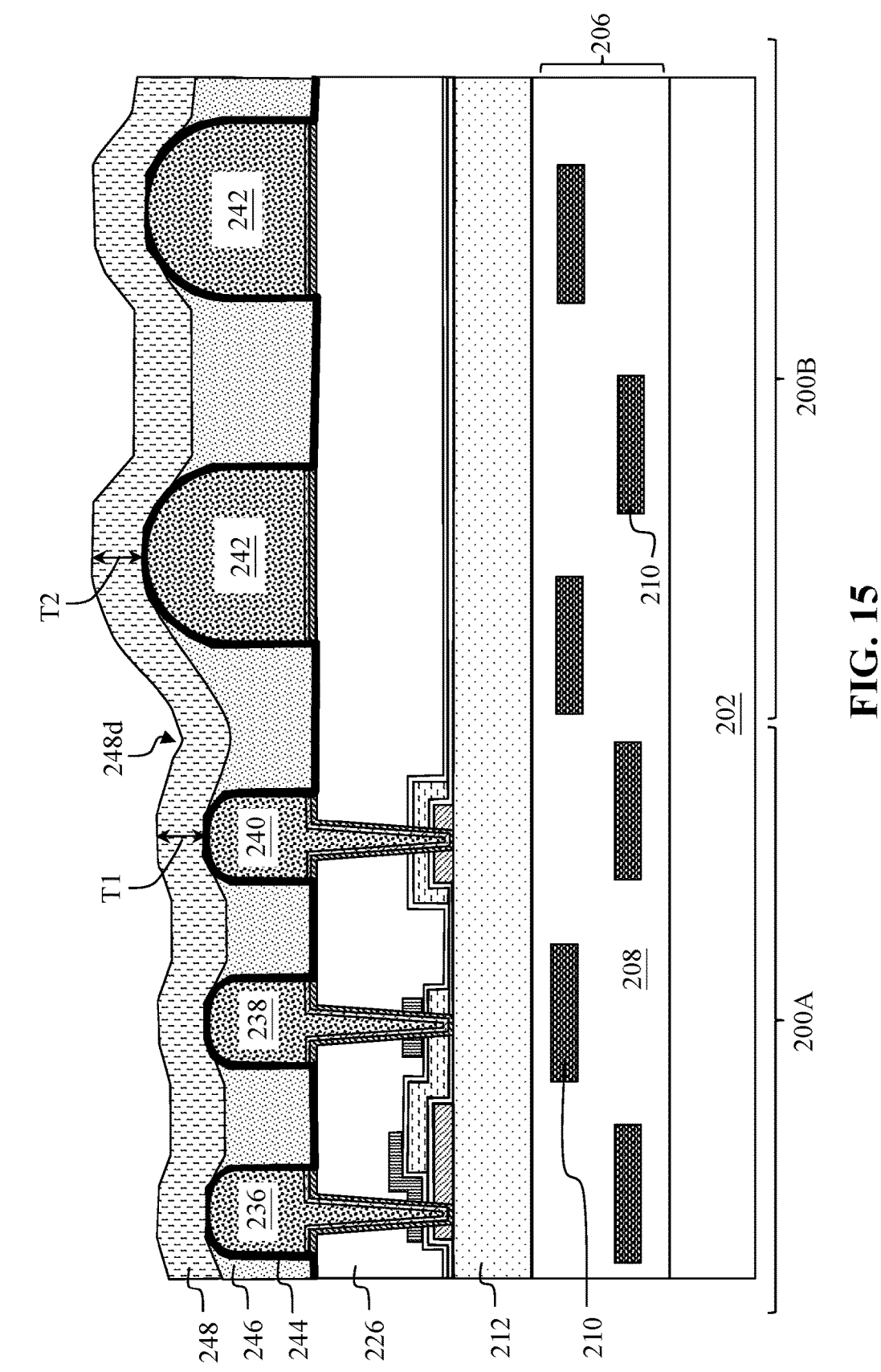

Referring to FIGS. 1 and 15, method 100 includes a block 118 where a dielectric layer 248 layer is conformally formed over the workpiece 200. After performing the planarization process 247, a dielectric layer 248 is conformally deposited to have a generally uniform thickness over the top surface of the workpiece 200. That is, a top surface of the dielectric layer 248 is non-planar and has a dished surface profile (e.g., curved surface 248d). The dielectric layer 248 may be deposited using CVD, ALD, or other suitable processes and may include USG. Since the planarization process 247 stops at the first etch stop layer 244 and the dielectric layer 248 is conformally deposited, a thickness T1 of the portion of the dielectric layer 248 disposed directly over the first-type conductive pad 236/238/240 is substantially equal to a thickness T2 of the portion of the dielectric layer 248 disposed directly over the second-type conductive pad 242. A ratio of the height difference H3 to a thickness difference (i.e., |T1-T2|) between the thickness T1 and the thickness T2 is greater than 20. In an embodiment, the thickness difference (i.e., |T1-T2|) between the thickness T1 and the thickness T2 is less than about 0.05 um.

Figure 16:
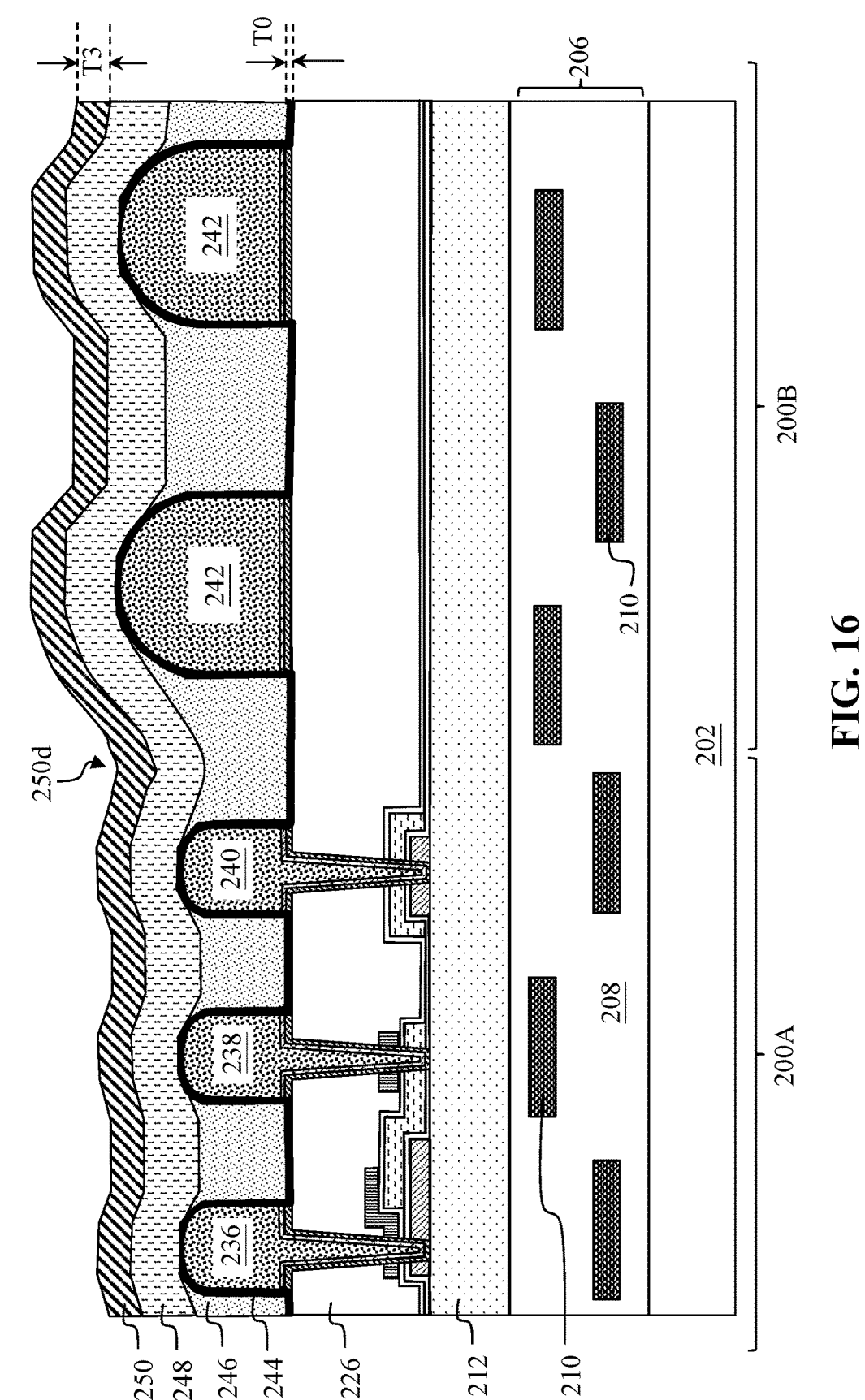

Referring to FIGS. 1 and 16, method 100 includes a block 120 where a second etch stop layer 250 is conformally formed over the workpiece 200. The second etch stop layer

Figure 17:
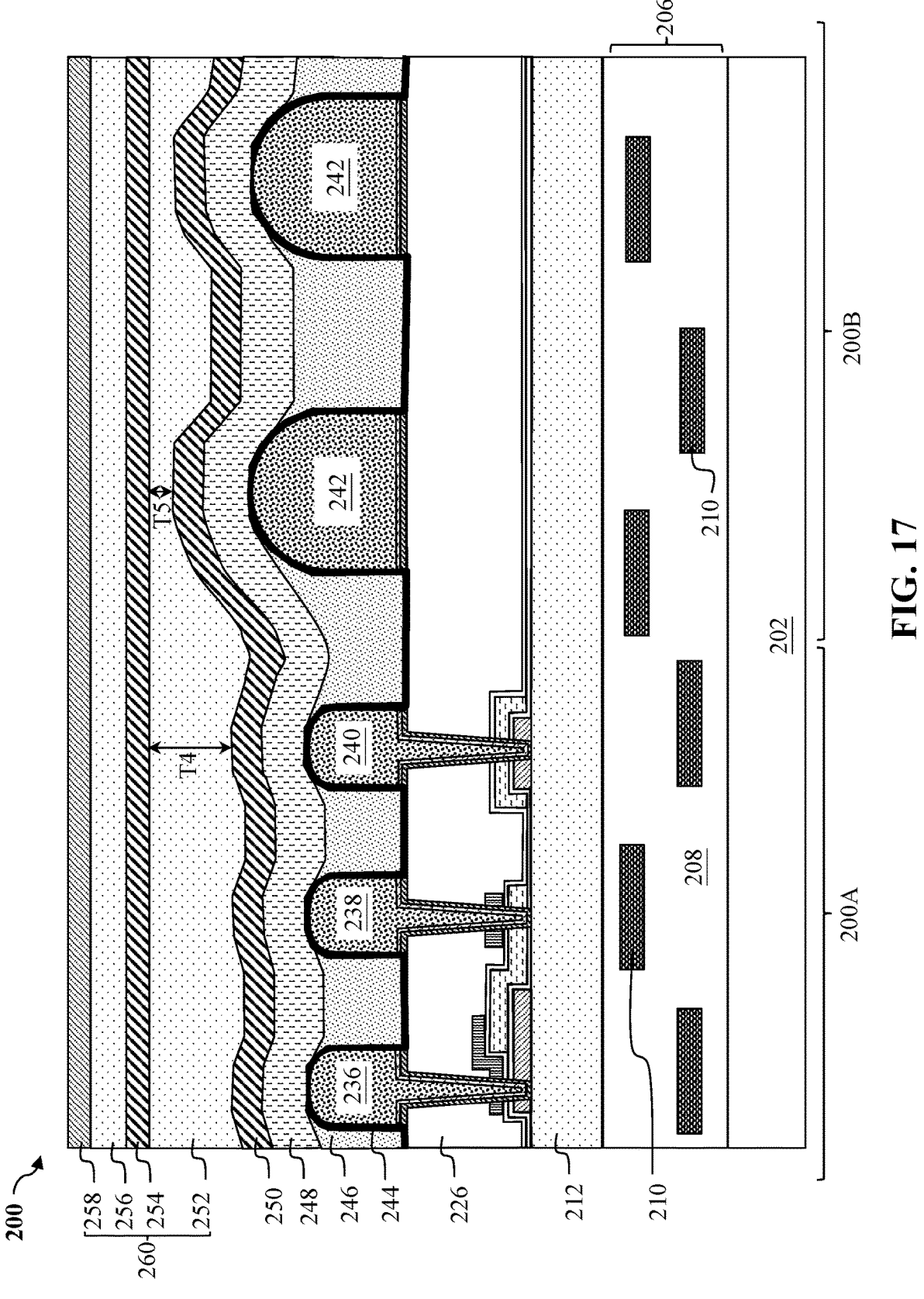

250 is conformally formed over the workpiece 200 using CVD, ALD, or a suitable deposition method and have a generally uniform thickness T3 over the top surface of the workpiece 200 over the workpiece 200. That is, a top surface of the second etch stop layer 250 is non-planar and has a dished surface profile (e.g., curved surface 250d). The second etch stop layer 250 is configured to indicate an etch end point of a subsequent etching process (e.g., etching process 264). In an embodiment, the second etch stop layer 250 includes silicon nitride (SiN). As illustrated in FIG. 17 and will be described later, a portion of a first dielectric layer 252 formed directly over the first-type conductive pad 236/238/240 is thicker than a portion of the first dielectric layer 252 formed directly over the second-type conductive pad 242. To provide a satisfactory etching result of a subsequent etching process, a thick second etch stop layer 250 (relative to the thin first etch stop layer 244) is formed so that the thick second etch stop layer 250 is able to sustain the etching process for a longer duration. In some embodiments, to achieve this goal, a ratio of the thickness T3 of the second etch stop layer 250 to the thickness TO of the first etch stop layer 244 is between about 2 and about 10. In an embodiment, the thickness T3 is between about 0.5 μm and about 3 um.

Referring to FIGS. 1 and 17, method 100 includes a block 122 where a multi-layer dielectric structure 260 is formed over the second etch stop layer 250. In the present embodiments, the formation of the multi-layer dielectric structure 260 includes forming a first dielectric layer 252 on the second etch stop layer 250. The first dielectric layer 252 may be formed using PVD, CVD, ALD, or a suitable deposition method. In an embodiment, the first dielectric layer 252 includes TEOS. As illustrated in FIG. 17, the first dielectric layer 252 has a non-planar bottom surface. After the deposition of the first dielectric layer 252, a planarization process is performed to the first dielectric layer 252 to provide the first dielectric layer 252 a substantially planar top surface. As illustrated in FIG. 17, the substantially planar top surface of the planarized first dielectric layer 252 is above the non-planar top surface of the second etch stop layer 250. Due to the non-planar top surface of the second etch stop layer 250 and the planarization of the first dielectric layer 252, a thickness T4 of the portion of the planarized first dielectric layer 252 disposed directly over the first-type conductive pad 236/238/240 is greater than a thickness T5 of the portion of the planarized first dielectric layer 252 disposed directly over the second-type conductive pad 242. The thickness difference (i.e., |T4-T5|) between the thickness T4 and the thickness T5 may be substantially equal to the height difference H3. However, as described above, due to the formation of the thick second etch stop layer 250, this thickness difference (i.e., |T4-T5|) would not significantly affect the etching result of the subsequent etching process 266.

After forming the first dielectric layer 252 having the substantially planar top surface, still referring to FIG. 17, the formation of the multi-layer dielectric structure 260 proceeds to forming a third etch stop layer 254. The third etch stop layer 254 is similar to the second etch stop layer 250. One of the differences between the third etch stop layer 254 and the second etch stop layer 250 includes that, the third etch stop layer 254 has a substantially planar top surface and a substantially planar bottom surface, and the second etch stop layer 250 has a non-planar top surface and a non-planar bottom surface. In an embodiment, the third etch stop layer 254 includes silicon nitride, and a thickness of the third etch stop layer 254 is sustainably equal to the thickness T3.

The formation of the multi-layer dielectric structure 260 then proceeds to forming a second dielectric layer 256 on the third etch stop layer 254. The second dielectric layer 256 may include TEOS and may act as a bond film. In some embodiments, the second dielectric layer 256 may be formed using ALD, CVD, or other suitable processes and have a substantially planar top surface. After forming the second dielectric layer 256, an anti-reflective layer 258 is deposited over the second dielectric layer 256 to improve photolithography process performance. In an embodiment, the anti-reflective layer 258 includes silicon oxynitride (SiON). The first dielectric layer 252, the third etch stop layer 254, the second dielectric layer 256, and the anti-reflective layer 258 are collectively referred to as the multi-layer dielectric structure 260. It is understood that the multi-layer dielectric structure 260 may have other configurations and include different dielectric layers.

Figure 18:
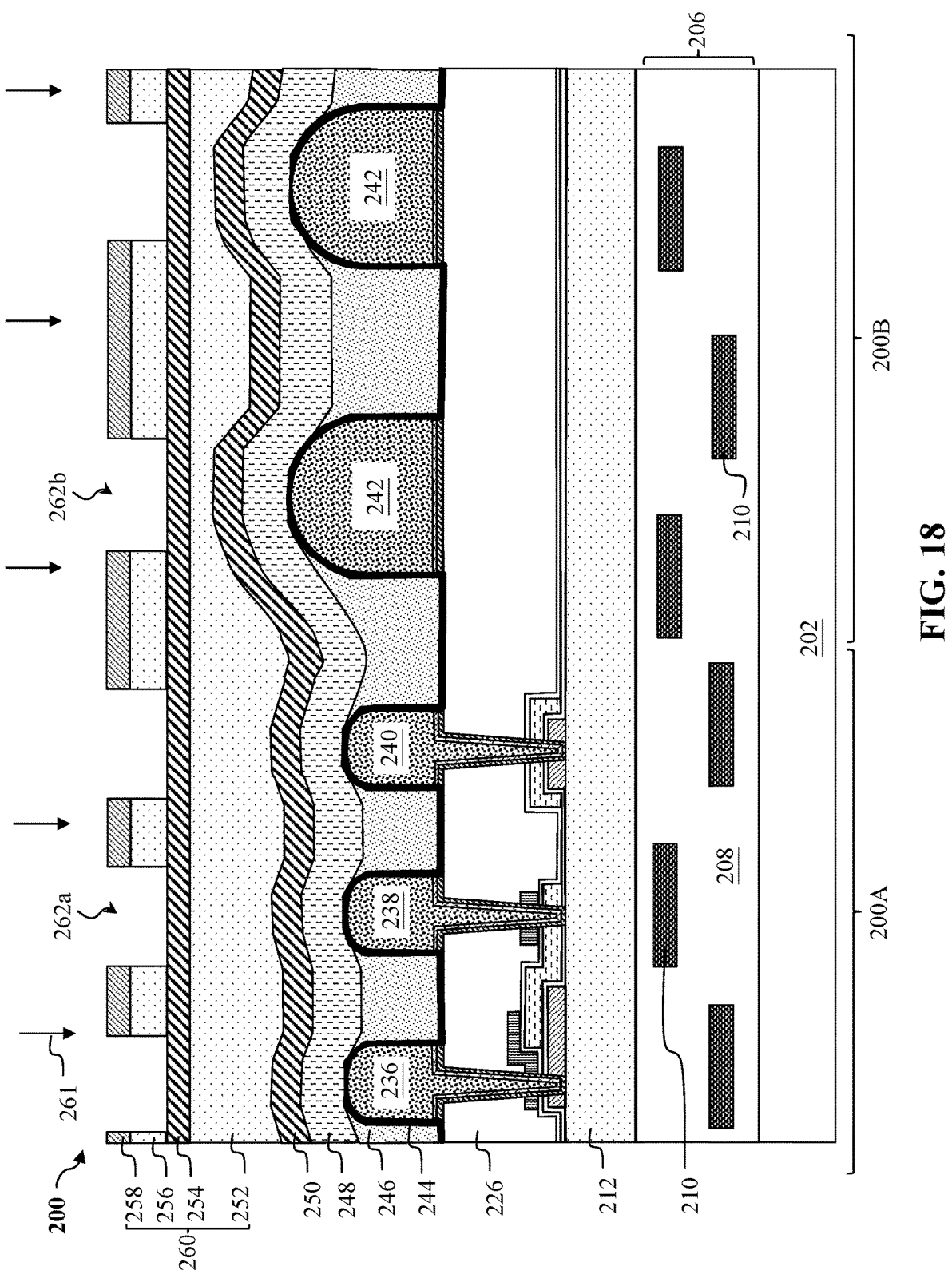

Referring to FIGS. 1 and 18-20, method 100 includes a block 124 where a number of etching processes are performed to form openings 270a exposing the first-type conductive pads 236/238/240 and openings 270b exposing the second-type conductive pads 242. With reference to FIG. 18, after forming the multi-layer dielectric structure 260, a first etching process 261 is performed to form openings 262a in the first region 200A and openings 262b in the second region 200B. In the present embodiments, the first etching process 261 stops at the third etch stop layer 254. A combination of lithography and the etching processes are performed to define the openings 262a and 262b illustrated in FIG. 18. For example, forming the openings 262a and 262b includes performing a lithography process to form a patterned resist layer on the multi-layer dielectric structure 260 and performing the first etching process 261 to transfer a pattern defined in the patterned resist layer to the anti-reflective layer 258 and the second dielectric layer 256. The lithography process can include forming a resist layer (not shown) on the anti-reflective layer 258 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The first etching process 261 uses the patterned resist layer as an etch mask to remove portions of the anti-reflective layer 258 and the second dielectric layer 256 to form the openings 262a and 262b. The patterned resist layer may be removed after the formation of the openings 262a and 262b.

Figure 19:
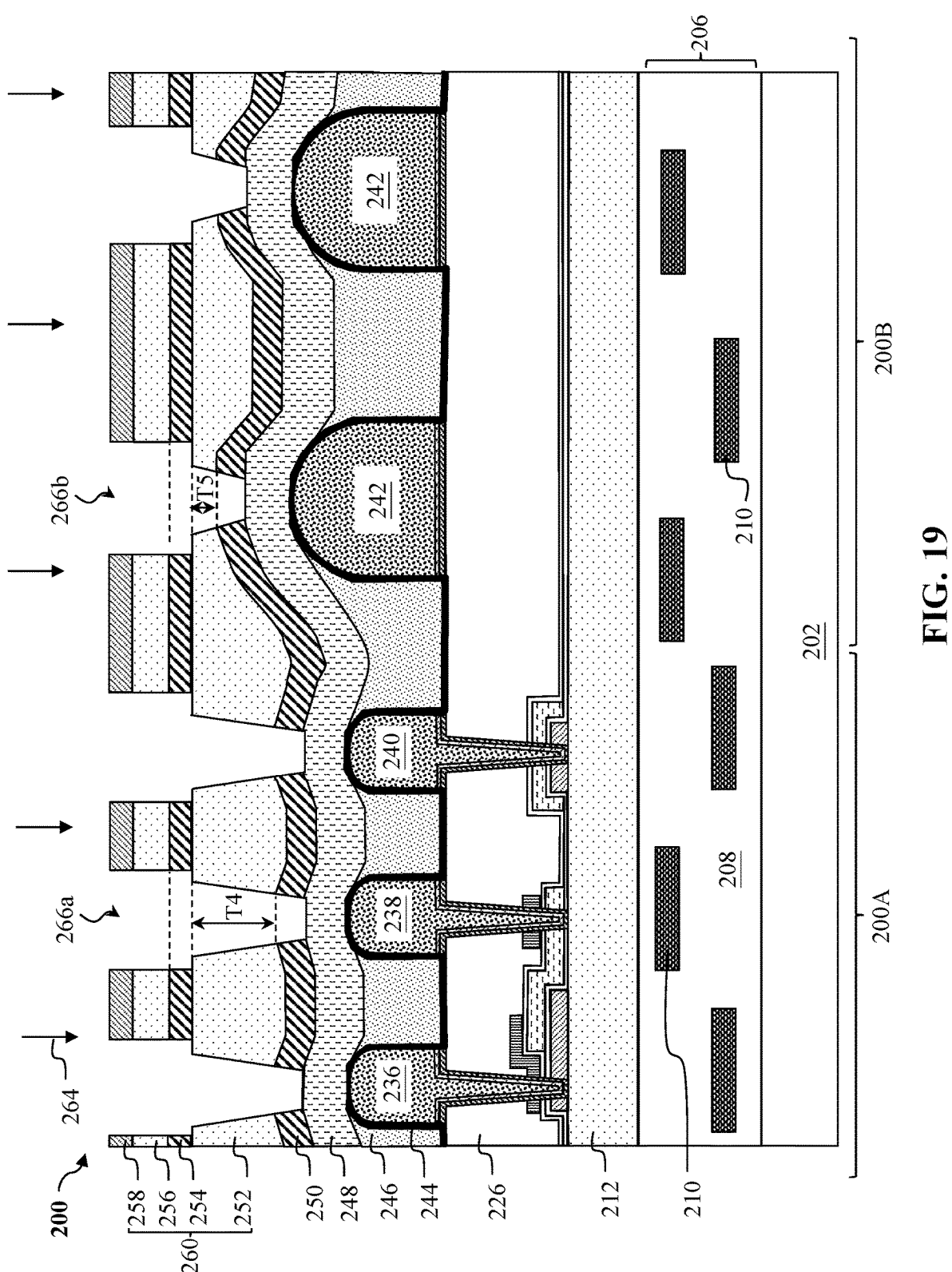

With reference to FIG. 19, after forming the openings 262a and 262b, a second etching process 264 is performed to vertically extend the openings 262a and 262b, thereby forming extended openings 262a in the first region 200A and extended openings 262b in the second region 200B. The extended openings 262a in the first region 200A may be referred to as openings 266a, and the extended openings 262b in the second region 200B may be referred to as openings 266b. A patterned mask film may be formed before the performing of the second etching process 264. In an embodiment, the second etching process 264 may implement a first etchant to selectively etch the third etch stop layer 254 with respect to the first dielectric layer 252, implement a second etchant to selectively etch the first dielectric layer 252 with respect to the second etch stop layer 250, and implement a third etchant to selectively etch the second etch stop layer 250. In other words, the second etching process 264 may include a subset of etching processes, and each one of the subset of etching processes is configured to achieve different functions. As described above with respect to FIG. 17, although the portion of the first dielectric layer 252 disposed directly over the first-type conductive pad 236/238/240 is thicker than the portion of the first dielectric layer 252 disposed directly over the second-type conductive pad 242, in addition to implement the etching process that can selectively etch the first dielectric layer 252 without substantially etching the second etch stop layer 250, the second etch stop layer 250 is configured to have a thickness that is able to sustain a longer etch duration. As such, the portion of the first dielectric layer 252 disposed directly over the first-type conductive pad 236/238/240 and the portion of the first dielectric layer 252 disposed directly over the second-type conductive pad 242 may be selectively removed within the etch duration without substantially damaging the second etch stop layer 250. That is, the thickness difference |T4-T5| may not significantly affect the etch results of the second etching process 264.

Figure 20:
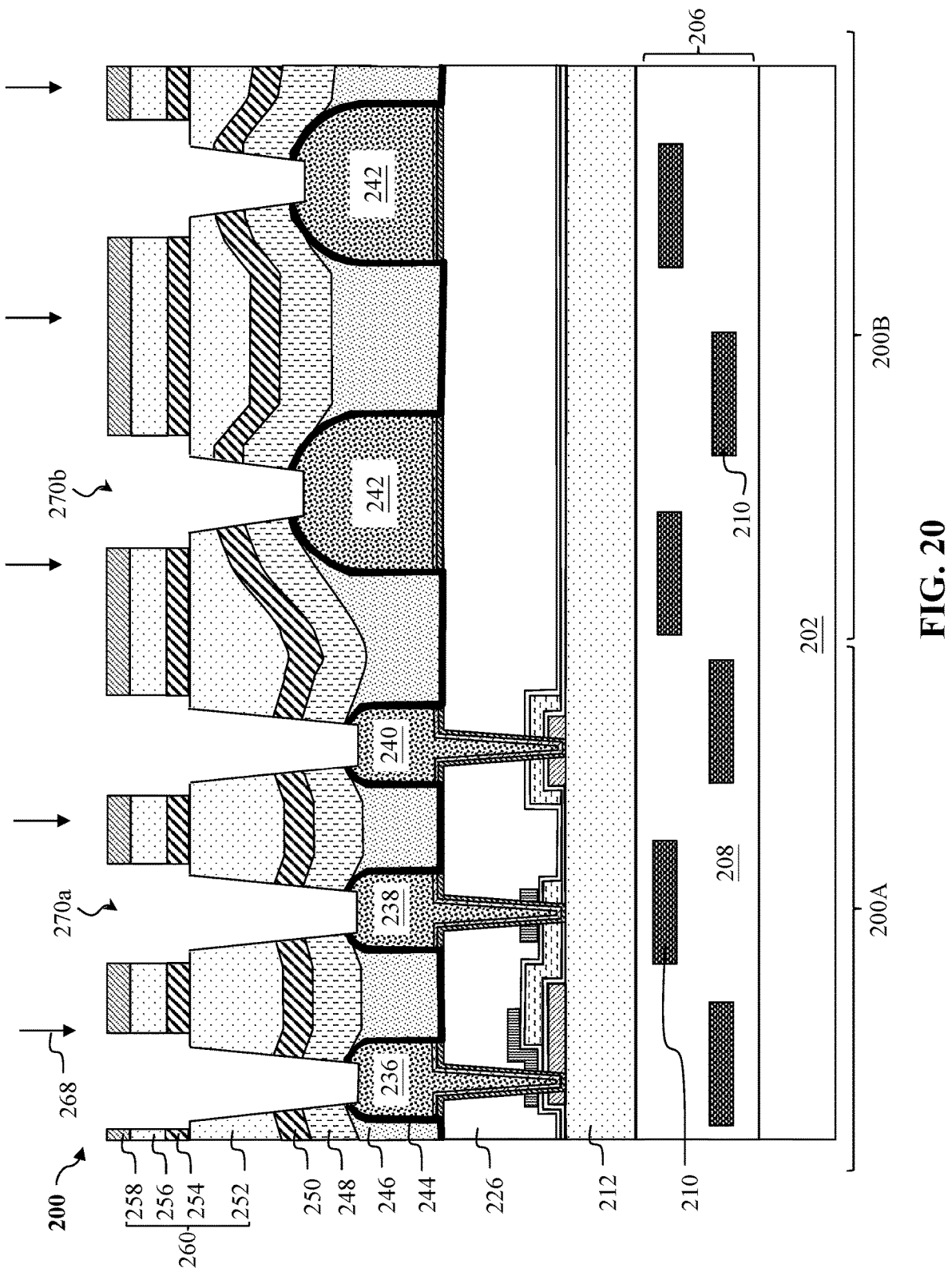

With reference to FIG. 20, after forming the openings 266a and 266b, a third etching process 268 is performed to vertically extend the openings 266a and 266b, thereby forming extended openings 266a in the first region 200A and extended openings 266b in the second region 200B. The extended openings 266a in the first region 200A may be referred to as openings 270a, the extended openings 266b in the second region 200B may be referred to as openings 270b. In an embodiment, the third etching process 268 may implement a first etchant to selectively etch the dielectric layer 248 and implement a second etchant to selectively etch the first etch stop layer 244 to expose the first-type and second-type conductive pads thereunder. The extent at which the dielectric layer 248 is etched may be controlled by the duration of the third etching process 268. As described above, the dielectric layer 248 is a conformal dielectric layer, and the thickness T1 (shown in FIG. 15) is substantially equal to the thickness T2 (shown in FIG. 15). The first etch stop layer 244 is also a conformal dielectric layer. Thus, the first-type conductive pad 236/238/240 and the second-type conductive pad 242 may be exposed by the openings 270a and 270b at substantially the same time. That is, after performing the third etching process 268, the extent at which the first-type conductive pad 236/238/240 is etched is substantially equal to the extent at which the second-type conductive pad 242 is etched. In an embodiment, the extent difference is less than about 0.05 um. Thus, by controlling the duration of the third etching process 268, the first-type conductive pads would not be under etched, and the second-type conductive pads would not be over etched, and satisfactory electrical connections between the conductive pads and the bonding structures 272/274 to be formed thereover may be provided.

Figure 21:
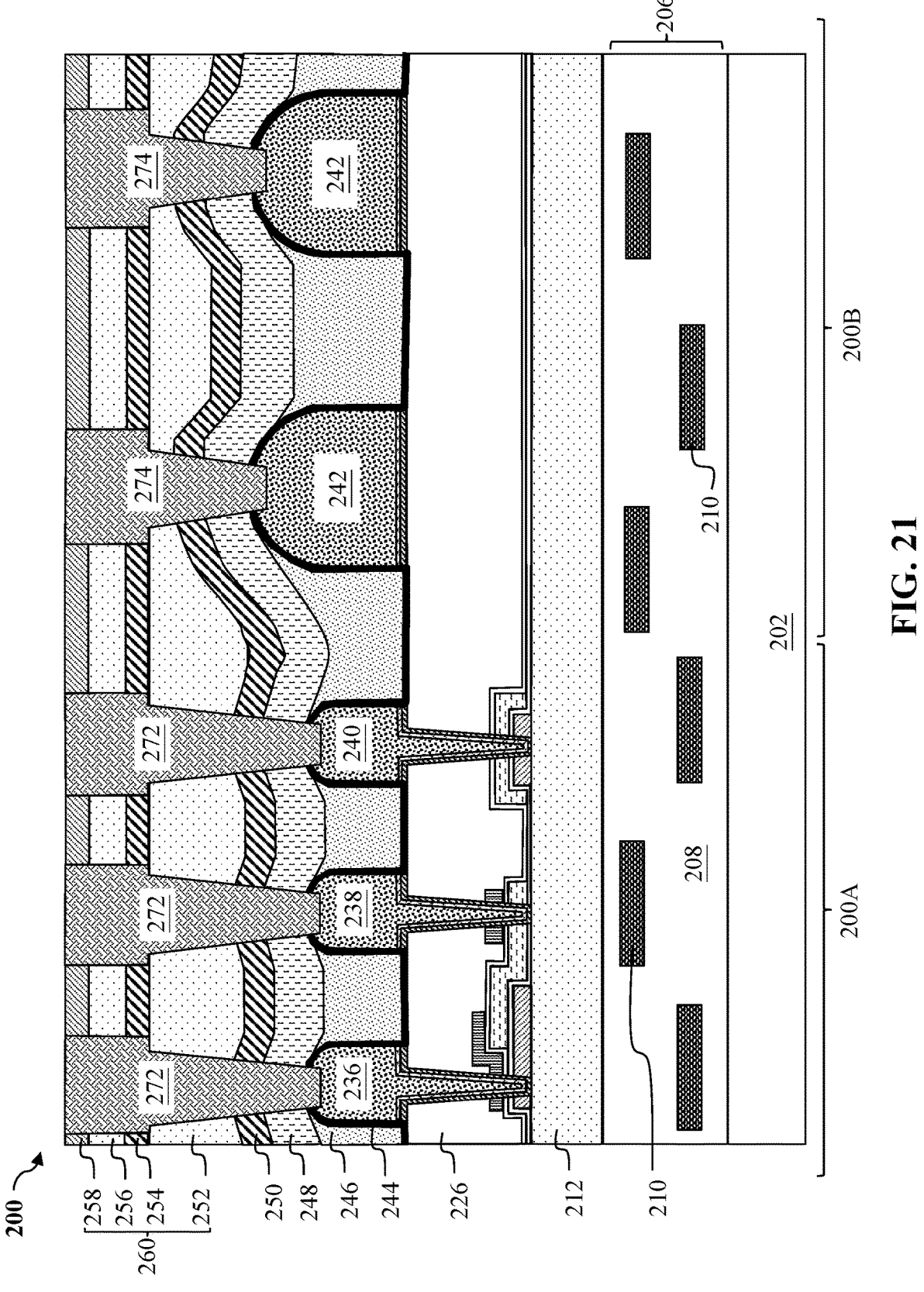

Referring to FIGS. 1 and 21, method 100 includes a block 126 where bonding structures 272 are formed in the openings 270a in the first region 200A and bonding structures 274 are formed in the openings 270b in the second region 200B. The formation of the bonding structures 272 and 274 may include depositing a conductive material over the workpiece 200 and into the openings 270a and 270b. In some embodiments, the conductive material may include a bi-layer structure. For example, to deposit the conductive material, a barrier layer (not separately labeled) is first conformally deposited over the workpiece and into the openings 270a and 270b using a suitable deposition technique, such as ALD or CVD and then a metal fill layer (not separately labeled) is deposited over the barrier layer using ALD, PVD, CVD, electroless plating, or electroplating. The barrier layer may include titanium nitride (TiN), tantalum nitride (TaN), or another metal nitride. The metal fill layer may be formed of any suitable material, such as copper (Cu), aluminum (Al). After the deposition of the conductive material, a planarization process (e.g., CMP) may be then performed such that the conductive material has a planar top surface. A portion of the conductive material formed above the first dielectric layer 252 may be referred to as a bonding pad metal line (BPM), and a portion of the conductive material formed under the bonding pad metal line may be referred to as a bonding pad via (BPV). The bonding structures 272 tracks the shape of the openings 270a, and the bonding structures 274 tracks the shape of the openings 270b.

Figure 22:
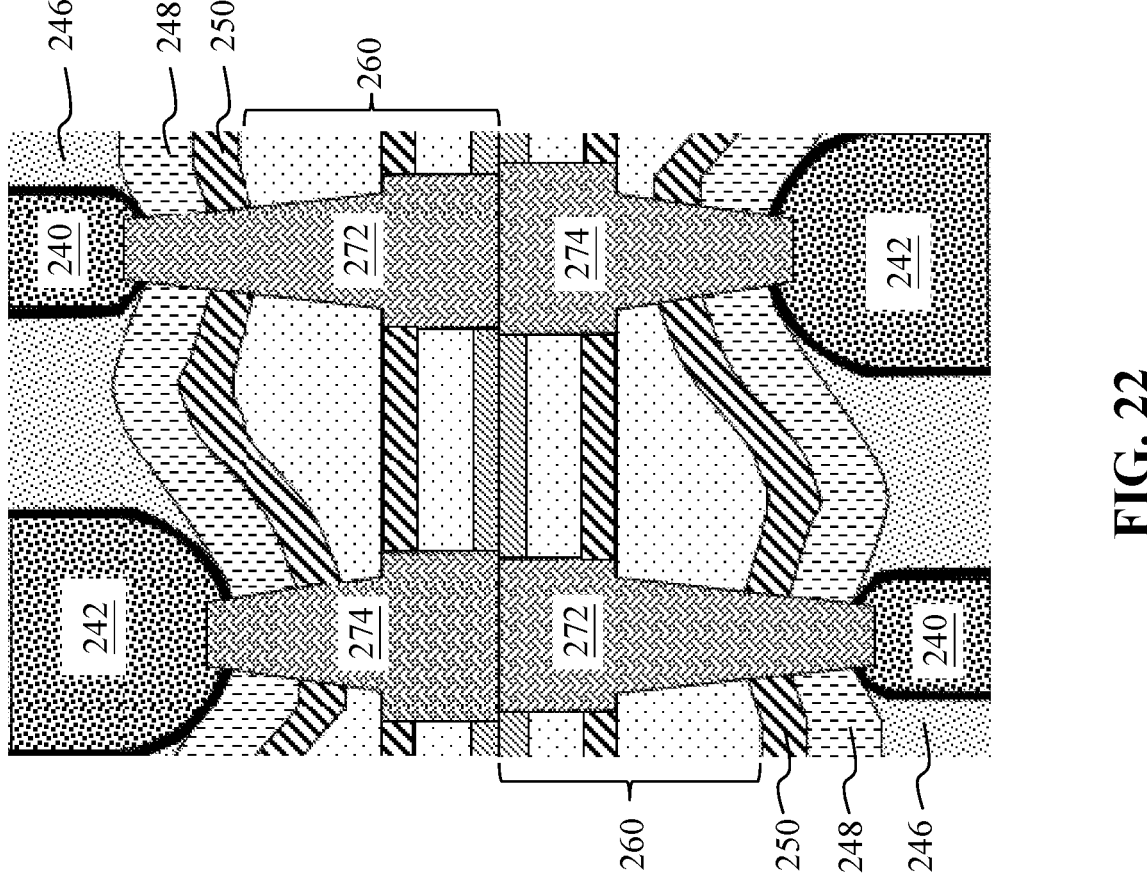

Referring to FIGS. 1 and 22, method 100 includes a block 128 where further processes are performed. Such further processes may include performing a singulation process along the scribe lines (not shown) of the workpiece 200 to separate adjacent device structures in the electrical circuitry of the workpiece 200 to form individual semiconductor dies. Prior to the singulation process, the backside of the substrate 202 may be attached to a carrier substrate (not shown) through an adhesive layer (not shown). The carrier substrate may be formed of semiconductor materials (e.g., silicon), or may be a glass substrate, a ceramic substrate, or the like. The adhesive layer may include a die attach film (DAF) such as an epoxy resin, a phenol resin, acrylic rubber, silica filler, or a combination thereof, and is applied using a lamination technique. The singulation process may include a plasma dicing process, a laser dicing process, a sawing process, or a combination thereof. Dielectric regions (otherwise known as "gap-fill dielectric" regions) may be formed surrounding the semiconductor die, in some embodiments. The dielectric regions may be formed from one or more layers of silicon oxide, PSG, BSG, BPSG, FSG, silicon nitride, the like, or a combination thereof and may be formed using a deposition process such as CVD, PECVD, PVD, the like, or a combination thereof. The individual semiconductor die is used in subsequent process steps to bond with another semiconductor die (see FIG. 22). In some embodiments, the semiconductor die is a memory die such as a dynamic random-access memory (DRAM) die, a static random-access memory (SRAM) die, a flash memory die, or may be another type of die. In some embodiments, the semiconductor die includes a logic die, which may be a central processing unit (CPU) die, a micro control unit (MCU) die, an input-output (IO) die, a baseband (BB) die, an application processor (AP) die, or the like.

Such further processes may also include bonding two semiconductor dies. The bonding operation may be performed through a pick-and-place procedure. Such further processes may also include forming under-bump metallurgies (UBMs). In some embodiments, each of the UBMs includes a barrier layer (not shown) and a seed layer (not shown) over the barrier layer. The barrier layer may be a titanium layer, a titanium nitride layer, a tantalum layer, a tantalum nitride layer, or a layer formed of a titanium alloy or a tantalum alloy. The materials of the seed layer may include copper or a copper alloy. Other metals such as silver, gold, aluminum, palladium, nickel, nickel alloys, tungsten alloys, chromium, chromium alloys, and combinations thereof may also be included in the UBMs. Such further processes may also include bonding the workpiece to a substrate, the substrate may be a printed circuit board (PCB), a substrate of another semiconductor die, an interposer die, or a substrate of other suitable devices.

Although not intended to be limiting, one or more embodiments of the present disclosure provide many benefits to a semiconductor structure and the formation thereof. For example, the present disclosure provides methods for forming bonding structures over ECP-formed conductive pads even when the ECP-formed conductive pads have different configurations and have non-coplanar top surfaces. The resulted semiconductor structure provides satisfactory electrical connections between the bonding structures and those conductive pads. In addition, the conductive pads are not over etched during the formation of the bonding structures. As such, yield and reliability of the semiconductor structure may be advantageously improved.

The present disclosure provides for many different embodiments. Semiconductor structures and methods of fabrication thereof are disclosed herein. In one exemplary aspect, the present disclosure is directed to a method. The method includes providing a workpiece having a first conductive pad over a first region of a substrate and a second conductive pad over a second region of the substrate, wherein a portion of the first conductive pad disposed directly over the substrate has a first height, and the second conductive pad has a second height greater than the first height, conformally forming a first etch stop layer on the first conductive pad and the second conductive pad, forming a dielectric structure over the first etch stop layer, performing a planarization process to the dielectric structure, and after the performing of the planarization process, conformally depositing a dielectric layer over the workpiece, the dielectric layer including a first portion disposed directly over the first conductive pad and a second portion disposed directly over the second conductive pad. A thickness difference between a first thickness of the first portion of the dielectric layer and a second thickness of the second portion of the dielectric layer is less than a height difference between the first height and the second height.

In some embodiments, the first region of the substrate includes a metal-insulator-metal capacitor embedded in a passivation structure. The first conductive pad includes a top portion formed directly over the passivation structure and has the first height. The first conductive pad further includes a bottom portion extending into the passivation structure, physically and electrically coupled to conductor plates of the metal-insulator-metal capacitor. An entirety of the second conductive pad is directly over the passivation structure. In some embodiments, each of the first conductive pad and the second conductive pad includes a seed layer and a metal fill layer on the seed layer. The metal fill layer includes copper (Cu). In some embodiments, the method further includes conformally forming a second etch stop layer over the workpiece, forming an oxide layer over the second etch stop layer, planarizing the oxide layer until the oxide layer having a substantially planar top surface above the second etch stop layer, forming a third etch stop layer over the planarized oxide layer, and forming a bond film over the third etch stop layer. A thickness of the second etch stop layer is greater than a thickness of the first etch stop layer. In some embodiments, a ratio of the thickness of the second etch stop layer to the thickness of the first etch stop layer is between about 2 and about 10. In some implementations, the method further includes performing a first etching process to the workpiece to form a first opening in the first region and a second opening in the second region, the first and second openings exposing the third etch stop layer, performing a second etching process to the workpiece to vertically extend the first and second openings, the extended first and second openings exposing the second etch stop layer, wherein a depth of an extended portion of the extended first opening is greater than a depth of an extended portion of the extended second opening, performing a third etching process to the workpiece to further vertically extend the extended first and second openings to expose the first and second conductive pads, respectively, and forming first and second bonding pads in the further extended first and second openings, respectively. In some instances, a composition of the first etch stop layer is the same as a composition of the second etch stop layer. In some implementations, a top surface of the second etch stop layer includes a dished surface profile. In some instances, a ratio of the height difference to the thickness difference is greater than 20.

In another exemplary aspect, the present disclosure is directed to a method. The method includes forming a first conductive feature over a first region of a substrate and a second conductive feature over a second region of the substrate, wherein a topmost point of a top surface of the second conductive feature is above a topmost point of a top surface of the second conductive feature, conformally depositing a first etch stop layer over the substrate, conformally depositing a dielectric layer over the first etch stop layer, conformally depositing a second etch stop layer over the dielectric layer, wherein the second etch stop layer includes a non-planar top surface, forming a multi-layer dielectric structure over the second etch stop layer, wherein the multi-layer dielectric structure includes a substantially planar top surface and a non-planar bottom surface, and forming a first bonding pad and a second bonding pad extending through the multi-layer dielectric structure, the second etch stop layer, the dielectric layer, and the first etch stop layer to physically and electrically coupled to the first conductive feature and the second conductive feature, respectively.

In some embodiments, the method further includes after the conformally depositing of the first etch stop layer over the substrate, forming a hybrid dielectric structure over the first etch stop layer, and performing a planarization process to the hybrid dielectric structure, wherein, after the performing of the planarization process, the hybrid dielectric structure includes a non-planar top surface. The conformally depositing of the dielectric layer over the first etch stop layer is performed after the performing of the planarization process. In some embodiments, the substrate includes a metal-insulator-metal capacitor in the first region of the substrate, and the forming of the first and second conductive features includes forming a passivation film over the metal-insulator-metal capacitor and the substrate, forming a via opening extending through the passivation film and exposing corresponding conductor plates of the metal-insulator-metal capacitor, and performing an electrochemical plating process (ECP) to form the first conductive feature in and over the via opening and the second conductive feature over the passivation film. In some implementations, each of the first conductive feature and the second conductive feature includes a seed layer and a metal fill layer on the seed layer, wherein the metal fill layer includes copper (Cu). In some embodiments, a thickness of the second etch stop layer is greater than a thickness of the first etch stop layer. In some instances, the first bonding pad extends into the first conductive feature by a first depth, and the second bonding pad extends into the second conductive feature by a second depth that is substantially equal to the first depth. In some instances, the multi-layer dielectric structure includes a non-planar bottom surface.

In yet another exemplary aspect, the present disclosure is directed to a semiconductor structure. The semiconductor structure includes a first conductive feature formed over a substrate, a second conductive feature formed over the substrate, and a topmost point of a top surface of the second conductive feature is above a topmost point of a top surface of the first conductive feature, a first conformal dielectric layer over the first conductive feature and the second conductive feature, a conformal oxide layer over the first conformal dielectric layer. The conformal oxide layer includes a first portion disposed directly over the first conductive feature and a second portion disposed directly over the second conductive feature. A thickness of the first portion is substantially equal to a thickness of the second portion. The semiconductor structure further includes a second conformal dielectric layer that is on the conformal oxide layer and includes a non-planar top surface, a multi-layer dielectric structure on the second conformal dielectric layer and having a substantially planar top surface, a first bonding structure on and electrically coupled to the first conductive feature, and a second bonding structure on and electrically coupled to the second conductive feature.

In some embodiments, a thickness of the second conformal dielectric layer is greater than a thickness of the first conformal dielectric layer. In some implementations, a top surface of the second conformal dielectric layer includes a dished surface profile. In some instances, the first conductive feature and the second conductive feature includes copper.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

providing a workpiece having a first conductive pad over a first region of a substrate and a second conductive pad over a second region of the substrate, wherein a portion of the first conductive pad disposed directly over the substrate has a first height, and the second conductive pad has a second height greater than the first height;

conformally forming a first etch stop layer on the first conductive pad and the second conductive pad;

forming a dielectric structure over the first etch stop layer;

performing a planarization process to the dielectric structure; and after the performing of the planarization process, conformally depositing a dielectric layer over the workpiece, the dielectric layer comprising a first portion disposed directly over the first conductive pad and a second portion disposed directly over the second conductive pad, wherein a thickness difference between a first thickness of the first portion of the dielectric layer and a second thickness of the second portion of the dielectric layer is less than a height difference between the first height and the second height.

2. The method of claim 1, wherein the first region of the substrate comprises a metal-insulator-metal capacitor embedded in a passivation structure, wherein the first conductive pad comprises a top portion formed directly over the passivation structure and has the first height, the first conductive pad further comprises a bottom portion extending into the passivation structure, physically and electrically coupled to conductor plates of the metal-insulator-metal capacitor, and wherein an entirety of the second conductive pad is directly over the passivation structure.

3. The method of claim 1, wherein each of the first conductive pad and the second conductive pad comprises a seed layer and a metal fill layer on the seed layer, wherein the metal fill layer comprises copper (Cu).

4. The method of claim 1, further comprising:

conformally forming a second etch stop layer over the workpiece;

forming an oxide layer over the second etch stop layer;

planarizing the oxide layer until the oxide layer having a substantially planar top surface above the second etch stop layer;

forming a third etch stop layer over the planarized oxide layer; and forming a bond film over the third etch stop layer, wherein a thickness of the second etch stop layer is greater than a thickness of the first etch stop layer.

5. The method of claim 4, wherein a ratio of the thickness of the second etch stop layer to the thickness of the first etch stop layer is between about 2 and about 10.

6. The method of claim 4, further comprising:

performing a first etching process to the workpiece to form a first opening in the first region and a second opening in the second region, the first and second openings exposing the third etch stop layer;

performing a second etching process to the workpiece to vertically extend the first and second openings, the extended first and second openings exposing the second etch stop layer, wherein a depth of an extended portion of the extended first opening is greater than a depth of an extended portion of the extended second opening;

performing a third etching process to the workpiece to further vertically extend the extended first and second openings to expose the first and second conductive pads, respectively; and forming first and second bonding pads in the further extended first and second openings, respectively.

7. The method of claim 4, wherein a composition of the first etch stop layer is the same as a composition of the second etch stop layer.

8. The method of claim 4, wherein a top surface of the second etch stop layer comprises a dished surface profile.

9. The method of claim 1, wherein a ratio of the height difference to the thickness difference is greater than 20.

10. A method comprising:

forming a first conductive feature over a first region of a substrate and a second conductive feature over a second region of the substrate, wherein a topmost point of a top surface of the second conductive feature is above a topmost point of a top surface of the first conductive feature;

conformally depositing a first etch stop layer over the substrate;

conformally depositing a dielectric layer over the first etch stop layer;

conformally depositing a second etch stop layer over the dielectric layer, wherein the second etch stop layer comprises a non-planar top surface;

forming a multi-layer dielectric structure over the second etch stop layer, wherein the multi-layer dielectric structure comprises a substantially planar top surface and a non-planar bottom surface; and forming a first bonding pad and a second bonding pad extending through the multi-layer dielectric structure, the second etch stop layer, the dielectric layer, and the first etch stop layer to physically and electrically coupled to the first conductive feature and the second conductive feature, respectively.

11. The method of claim 10, further comprising:

after the conformally depositing of the first etch stop layer over the substrate, forming a hybrid dielectric structure over the first etch stop layer; and performing a planarization process to the hybrid dielectric structure, wherein, after the performing of the planarization process, the hybrid dielectric structure comprises a non-planar top surface, wherein the conformally depositing of the dielectric layer over the first etch stop layer is performed after the performing of the planarization process.

12. The method of claim 10, wherein the substrate comprises a metal-insulator-metal capacitor in the first region of the substrate, and the forming of the first and second conductive features comprises:

forming a passivation film over the metal-insulator-metal capacitor and the substrate;

forming a via opening extending through the passivation film and exposing corresponding conductor plates of the metal-insulator-metal capacitor; and performing an electrochemical plating process (ECP) to form the first conductive feature in and over the via opening and the second conductive feature over the passivation film.

13. The method of claim 12, wherein each of the first conductive feature and the second conductive feature comprises a seed layer and a metal fill layer on the seed layer, wherein the metal fill layer comprises copper (Cu).

14. The method of claim 10, wherein a thickness of the second etch stop layer is greater than a thickness of the first etch stop layer.

15. The method of claim 10, wherein the first bonding pad extends into the first conductive feature by a first depth, and the second bonding pad extends into the second conductive feature by a second depth that is substantially equal to the first depth.

16. The method of claim 10, wherein the multi-layer dielectric structure comprises a non-planar bottom surface.

17. A method, comprising:

forming a first conductive feature over a first region of a substrate and a second conductive feature over a second region of the substrate;

conformally depositing a first etch stop layer over the substrate;

depositing a dielectric layer over the first etch stop layer;

performing a planarization process to the dielectric layer, wherein, upon completion of the performing of the planarization process, the dielectric layer has a non-planar top surface;

depositing a second etch stop layer over the dielectric layer, wherein the second etch stop layer comprises a non-planar top surface;

depositing a third etch stop layer over the second etch stop layer, wherein the third etch stop layer comprises a substantially planar top surface;

forming a multi-layer dielectric structure over the third etch stop layer; and forming a first bonding pad and a second bonding pad extending through the multi-layer dielectric structure, the third etch stop layer, the second etch stop layer, the dielectric layer, and the first etch stop layer to physically and electrically coupled to the first conductive feature and the second conductive feature, respectively, wherein the first bonding pad and the second bonding pad have different heights.

18. The method of claim 17, wherein a top surface of the first conductive feature is lower than a top surface of the second conductive feature.

19. The method of claim 17, wherein the forming of the first conductive feature and the second conductive feature comprises:

receiving the substrate, wherein the substrate comprises a metal-insulator-metal capacitor in a passivation structure;

forming a via opening extending into the passivation structure and exposing corresponding a conductor plate of the metal-insulator-metal capacitor; and performing an electrochemical plating process (ECP) to form the first conductive feature in and over the via opening and the second conductive feature over the passivation structure.

20. The method of claim 17, wherein a thickness of the second etch stop layer is greater than a thickness of the first etch stop layer.

* * * * *